United States Patent

Koya et al.

[11] Patent Number: 5,096,801
[45] Date of Patent: Mar. 17, 1992

[54] COLOR IMAGE RECORDING METHOD

[75] Inventors: Keizo Koya; Kozo Sato; Yoshiharu Yabuki; Hiroshi Hara, all of Kanagawa, Japan

[73] Assignee: Fuji Photo Film Co., Ltd., Kanagawa, Japan

[21] Appl. No.: 503,643

[22] Filed: Apr. 3, 1990

[30] Foreign Application Priority Data

Apr. 3, 1989 [JP] Japan ............................ 1-84204
Jun. 29, 1989 [JP] Japan ............................ 1-167972

[51] Int. Cl.$^5$ ............................ G03C 5/00; G03C 5/18
[52] U.S. Cl. ............................ 430/293; 430/143; 430/292; 430/294
[58] Field of Search ............... 430/293, 294, 292, 143

[56] References Cited

U.S. PATENT DOCUMENTS

| | | | |
|---|---|---|---|
| 4,311,773 | 1/1982 | Kaneko et al. | 430/292 |
| 4,335,197 | 6/1982 | Chambers et al. | 430/294 |
| 4,551,408 | 11/1985 | Mino et al. | 430/294 |
| 4,729,935 | 3/1988 | Walls et al. | 430/294 |
| 4,737,436 | 4/1988 | Thompson | 430/143 |

Primary Examiner—Marion E. McCamish
Assistant Examiner—Mark A. Chapman
Attorney, Agent, or Firm—Sughrue, Mion, Zinn, Macpeak & Seas

[57] ABSTRACT

A novel color image recording method is provided, which comprises exposing to light a light-sensitive material obtained by dispersing a composition containing at least a photopolymerization initiator, a color image-forming substance and a polymerizable compound in a hydrophilic binder and then coating said dispersion on a support, subjecting said polymerizable compound in the exposed portions to polymerization, and then (a) eluting said color image-forming substance contained in the unpolymerized polymerizable compound in the unexposed portions with an alkaline aqueous solution or (b) subjecting said color image-forming substance contained in the unpolymerized polymerizable compound in the unexposed portions to chemical change so that it is discolored, thereby forming dye images.

13 Claims, No Drawings

COLOR IMAGE RECORDING METHOD

FIELD OF THE INVENTION

The present invention relates to a color image recording method. More particularly, the present invention relates to a novel simple color image recording method which comprises imagewise polymerizing a polymerizable compound finely dispersed in a binder with a photopolymerization initiator to fix a coexisting color image-forming substance, and then washing off said color image-forming substance in the unpolymerized portions with an alkaline aqueous solution or discoloring said color image-forming substance in the unpolymerized portions with a processing solution.

BACKGROUND OF THE INVENTION

The image formation process utilizing photopolymerization involves a chemical sensitization by chain reaction, and the images thus formed are considered to exhibit a highest sensitivity in the nonsilver salt system photography.

The photopolymerization recording system can utilize polymerization, which is a great physical change, and thus can find a wide range of application. Thus, it goes without saying that many studies have been made on the photopolymerization recording system.

The application of the photopolymerization recording system can be roughly divided into two major groups. In one of the two major groups, the physical properties of polymer images themselves (strength, solubility, transmission, water repellency, etc.) are utilized. Examples of such an application include relief, resist, and PS (presensitized) plate. In the other group, polymer images are visualized as media which are then used as color images. Examples of such an application include color proof.

The former application has advantages which are not seen in the silver salt system photography. Despite its low sensitivity, the former application is so advantageous that it has already found various industrial uses.

However, the latter application provides too low a sensitivity, and its use is limited. Therefore, many approaches which comprise the use of silver halide as sensors have been studied.

However, from a different point of view, the color image formation process utilizing photopolymerization is greatly advantageous in that as compared to the silver salt system photography it is free of silver and thus costs less and needs no processing for the removal of silver halide or silver.

Photopolymerization color image recording materials and color image recording methods which can make the best use of these advantages have been studied.

With the exception of special examples (e.g., the case where the monomer itself serves to color as N-vinylcarbazole-carbon tetrabromide light-sensitive materials), it is difficult to directly form visual images by photopolymerization using ordinary photopolymerizable compounds. This is one of the reasons why the photopolymerization system can be hardly applied for the ordinary color image recording process.

In order to visualize images in the photopolymerization recording system, the following physical treatment is needed. In particular, the exposed or unexposed portions are selectively dyed with a dye solution or colored upon being attached to a pigment powder by their difference in permeability or adhesiveness, or a light-sensitive layer which has been previously colored is imagewise exposed to light to form the corresponding polymer image, and the uncured portions are then washed off or peeled off by the use of the difference between the cured portions and the uncured portions in physical properties such as solubility or adhesiveness.

A number of approaches have been proposed for directly visualizing images by chemical reaction in a light-sensitive material comprising a photopolymerizable composition without externally coloring the material or spatially separating the exposed portion from the unexposed portion. In JP-A-52-89915 (the term "JP-A" as used herein means an "unexamined published Japanese patent application"), a method is proposed which comprises the formation of positive-positive visible images by heat development of a photopolymerizable composition and a heat-sensitive coloring material. However, this approach is disadvantageous in that it uses a binary heat-sensitive coloring substance consisting of two components which must be separately positioned inside and outside or on the opposite sides of the photopolymerizable composition.

In JP-A-57-179836, JP-A-57-197538, JP-A-58-23024, and JP-A-58-23025, methods are described which comprise the compression of a photopolymerizable composition and a heat-sensitive (pressure-sensitive) coloring material to form visible images. However, all these methods are disadvantageous in that one of the two components constituting a binary coloring substance must be contained in microcapsules together with the photopolymerizable composition and a pressuring process is needed to destroy uncured capsules.

The above mentioned process which utilizes reaction to form dyes is disadvantageous in that the molecular design of leuco dyes to be used is extremely limited and the dyes thus formed exhibit a poor stability. As described above, the formulations of the composition are complex and subject to various limitations. For example, it is difficult to form a color image of two or more colors. This process is also disadvantageous in that it involves diffusion or transfer which normally deteriorates image sharpness.

Besides these approaches, there have been made many other improvements or approaches. However, these approaches leave to be desired. Further studies are needed to provide a simple, stable and sharp photopolymerizable color image-forming material.

Furthermore, it is difficult to apply the photopolymerization recording system for full-color image-forming material which provides two or more, preferably three or more colors.

To this end, a number of approaches have been developed and put into practical use. For example, a photopolymerizable layer is previously colored with a pigment every single color. After polymerization, the unpolymerized portions are eluted with a solvent. In another process, peeling development is effected to separate the polymerized portions and the unpolymerized portions onto different sheets. In an alternate method, the adhesiveness of the unpolymerized portions is used to adsorb a colored powder. Furthermore, after the unpolymerized portions are washed off, the remaining polymerized portions are dyed. However, these approaches are disadvantageous in that complex steps such as coating, drying, polymerization and processing are needed according to the number of colors required. In addition, precision positioning is required. Thus, the finished color images are obtained in a low yield and at a rather high cost.

In order to minimize the number of sequential steps every single color, some approaches have been proposed. In a process disclosed in JP-A-59-30537, cyan, magenta and yellow color image sheets are exposed to a three color-separated image, and images are then transferred to a development sheet three times to form a full-color image. However, even this process involves tedious exposure and transfer processes. Furthermore, a problem of positioning images cannot be eliminated in this process.

In the photopolymerization color image formation process described in JP-A-62-143044, a material and method which employ only one exposure and one processing to form a full-color image are proposed.

This full-color image-forming material comprises a light-sensitive layer containing three sets of micro-capsules. Each set of microcapsules have distinctly different sensitivities in a selective wavelength range up to the visible spectrum (400 to 700 nm). These microcapsules are combined with cyan, magenta and yellow image-forming agents. These combinations are subjected to pressurization and transfer so that they are allowed to color to form a full-color image.

The expansion of color sensitivity to the visible range is rather significant to the photopolymerization image recording method. However, this microcapusle-coloring process leaves to be desired in image sharpness and stability as described above.

On the other hand, U.S. Pat. No. 3,579,339 proposes another coloring process. In this process, a photopolymerizable composition containing a color coupler of the type used in silver halide color films is bonded to gelatin or the like. The photopolymerizable composition is then coated on a support to prepare a light-sensitive layer containing small light-sensitive polymerizable drops. After exposure, a liquid coloring agent is allowed to penetrate into the unpolymerized oil portions to cause coupling reaction.

Furthermore, JP-A-60-120353 discloses a recording material comprising a combination of an ununiform dispersion of a polymerizable monomer in a binder and a dye to be bleached with the monomer.

These systems are advantageous in that they enable multi-layer coating, and if these monomer oil drops have different sensitivities, a full-color image can be formed at a shot. Furthermore, since these systems involve no physical destruction such as transfer and removal of monomer layer, an easy processing can be effected and a high sharpness can be secured.

However, these dyes produced by coloring reaction or monomer-bleachable dyes are disadvantageous in that the final color images formed of these dyes exhibit a very poor stability. These systems are further disadvantageous in that the degree of freedom of design of dyes having an excellent hue required for color images is very small. Thus, these systems are impractical.

As described above, the photopolymerization color image formation method finds a rather wide range of application. Among these applications, color filters, which have recently found an increasing need, are noteworthy.

In the recent progress of microelectronics, there is an increasing demand for visual data transmission, and various visual apparatus have been developed. Among these visual apparatus, color filters are very significant to provide full-color visual data.

In recent years, small-sized television cameras for home use have employed a solid pickup element such as CCD, BBD and MOS. Such a solid pickup element comprises a large number of finely divided light-receiving portions and a drive circuit for receiving data from the light-receiving portions. In order to obtain color images, a color filter must be positioned on the solid pickup element.

On the other hand, small-sized, thin type and light-weight color displays which can substitute for the conventional color CRT's have been on development. For example, various color display systems utilizing liquid crystal, plasma, fluorescent display tube, electro-luminescence or the like have been proposed.

Among these color display systems, the liquid crystal display system is advantageous in that it can be driven at a low voltage and low power, produced in a thin and light-weight form and has a prolonged life. Thus, the liquid crystal system has come into the limelight. There are various color liquid crystal display systems. Examples of these color liquid crystal display systems include guest-host system (GH system, utilizing a mixture of a binary dye and a liquid crystal), ECB system (electrically controlled bi-refringernce system, utilizing birefringence of liquid crystal), and light shutter system (system utilizing a combination of a liquid crystal cell and a color filter). Among these systems, the light shutter system can correspond to full-color display and is thus considered to be nearest to practical use.

In the light shutter system, the light transmission is controlled by liquid crystal cells in connection with color filters to effect a full-color display. This enables the display of any colors in the color triangle in the CIE chromaticity diagram utilizing the additive process.

The most color filters used to provide a full-color display comprise an array of three primaries (blue, green, red) regularly arranged in mosaic or stripe and optionally have four or more hues. For example, micro color filters for use in solid pickup elements employ black stripes for complete separation of colors between multi-color pattern segments. Also, color filters for use in liquid crystal display often employ black stripes for the purpose of completely separating colors or blocking light to TFT provided in the gap between the above mentioned three primary filters to lower on-current, thereby controlling on-off of light shutter.

As methods for the preparation of color filters there have been known dyeing process, vacuum deposition process, electrodeposition process, interference film process, printing process, and photographic process.

Among these processes, the dyeing process has been most widely used because of its high reliability. In the dyeing process, a polymer such as polyvinyl alcohol and gelatin is coated on a support to form a dye-accepting layer (mordanting layer) on which color elements (pixels) are then formed with a coloring substance such as dye.

Specifically, as described in U.S. Pat. No. 3,289,208, this process normally comprises the steps of: 1) coating a gelatin layer which has become light-sensitive by the addition of potassium bichromate, patternwise exposing the material to light, and washing the material with warm water to form a relief image; 2) dyeing the gelatin left as the relief image with a red dye from a red dye solution; 3) coating an interlayer on the dyed layer; 4) repeating the step 1); 5) dyeing the material with a dyed from a green dye solution; 6) coating interlayer on the dyed layer; 7) repeating the step 1); 8) dyeing the material with a blue dye from a blue dye solution; and 9) coating a protective layer on the material.

However, the dyeing process is disadvantageous in that it requires tedious steps as described above and the color filter thus obtained has a complex structure which is subject to pinhole or flaw.

Many approaches have been proposed to eliminate these disadvantages. For example, U.S. Pat. No. 4,236,098 describes a process which comprises the absorption of dyes by a gelatin layer from a dye solution through window-shaped patterns formed by photoresist technology. In approaches described in U.S. Pat. Nos. 4,081,277 and 4,168,448, heat-sublimable dyes or heat-transferable dyes are transferred to a dye-accepting layer through window-shaped patterns formed of photoresist.

However, these approaches are disadvantageous in that they need to repeat tedious steps such as photoresist coating, development and peeling which result in a poor yield.

Furthermore, in order to eliminate the step of coating a dye barrier interlayer and improve the resistance of dyes in the photoresist process, an approach has been proposed which comprises the use of a pigment-containing photoresist. However, even this process requires steps of coating, drying, exposure and washing every single color and thus leaves to be desired in simplicity and yield.

Other color filter production methods, too, have problems. In the dye vacuum-deposition process, a dye is evaporated and subjected to list-off process to obtain pixels. This process enables a direct formation of such a thin film on a transparent electrode. However, this process is disadvantageous in that the film thus formed exhibits a poor adhesion to the substrate. Color filters comprising an inorganic vacuum-deposited multi-layer interference film exhibit an excellent heat resistance. However, this process is disadvantageous in that the thickness of the interference film can be hardly controlled, causing problems of cost and yield. In the electrodeposition process, a high-molecular weight compound is electrodeposited on an electrode to form a color filter. However, this process is disadvantageous in that it is difficult to make a free arrangement of pixels, making it impossible to make black stripes. The printing process can provide a larger picture and enables mass production as compared to the above mentioned photoresist process. However, this process is disadvantageous in that the film thus formed exhibits a poor dimensional stability, making it impossible to obtain satisfactory properties such as film uniformity and smoothness. Various photographic processes have been studied. However, the conventional photographic processes comprise processing a coupler dispersed in a light-sensitive silver halide emulsion film with a color developing solution to form a nondiffusible dye, and then desilvering the material to form a color filter. Thus, this process is disadvantageous in that it requires tedious processing steps and the color filter thus prepared has a large film thickness and thus exhibits poor properties such as sharpness and hue.

As described above, color filters are very significant for the supply of full-color visual data. However, the conventional color filter production methods require tedious steps which cause a poor yield. Furthermore, color filters thus produced exhibit a poor quality. In particular, it has been keenly desired to provide a process for the preparation of a color filter for large picture with an excellent quality in a simple process.

SUMMARY OF THE INVENTION

It is therefore an object of the present invention to provide a photopolymerizable color image recording material which exhibits an excellent performance in a simple treatment.

It is another object of the present invention to provide a method of forming a full-color image on said color image recording material at a shot.

It is a further object of the present invention to provide a process for the preparation of a micro color filter by using said color image recording method.

These and other objects of the present invention are accomplished by a color image recording method, which comprises exposing to light a light-sensitive material obtained by dispersing a composition containing at least a photopolymerization initiator, a color image-forming substance and a polymerizable compound in a hydrophilic binder and then coating said dispersion on a support, subjecting said polymerizable compound in the exposed portions to polymerization, and then (a) eluting said color image-forming substance contained in the unpolymerized polymerizable compound in the unexposed portions with an alkaline aqueous solution or (b) subjecting said color image-forming substance contained in the unpolymerized polymerizable compound in the unexposed portions to chemical change so that it is discolored, thereby forming dye images.

In the embodiment (a) of the present invention, little or no color image-forming substance is eluted with the alkaline aqueous solution at the cured portions of the polymerizable compound (Dmax portions) to keep a high maximum density (Dmax). On the other hand, the color image-forming substance is readily extracted from the polymerizable compound into the aqueous phase during the treatment with the alkaline aqueous solution in the unpolymerized portions to attain a very low minimum density (Dmin).

In the embodiment (b) of the present invention, the color image-forming substance undergoes little or no discoloration in the cured portions of the polymerizable compound (Dmax portions) during the treatment to keep a high Dmax. On the other hand, the color image-forming substance readily undergoes discoloration in the polymerizable compound in the unpolymerized portions during the treatment to keep a very low Dmin.

It was also found that a sufficient gradation can be obtained by selecting a suitable degree of cure (polymerization) in both the embodiments (a) and (b).

As a result, a color image having an excellent sharpness, S/N ratio and fastness could be successfully formed. Accordingly, even with this approach alone, a novel image-forming material and an image-forming material comprising this material can be provided.

However, a multi-color or full-color image-forming material can be easily realized by finely dispersing the polymerizable compound in a water-soluble binder.

For example, a multi-color image-forming material can be easily provided by using a multi-layer construction combined with spectral sensitized photopolymerization initiators. Furthermore, an excellent full-color image-forming material can be provided by using a three-color (yellow, magenta and cyan) three-layer construction.

The novel color image forming method can find the same applications as the ordinary silver salt system photography. In addition, it was found that the novel color image forming method, taking advantage of its high resolving power, high stability and high hue, and even its feature which has been a defect in a photopolymerization system, i.e., binary (on-off) response rather than continuous gradation, can find a great usefulness as color filter, which has been difficult to produce in the ordinary silver salt color photography. In accordance with the present invention, a high quality color filter can be easily (at a low cost) prepared.

DETAILED DESCRIPTION OF THE INVENTION

The present invention will be further described hereinafter.

Referring particularly to the present color image-forming substance, such a color image-forming substance is a pre-formed (pre-colored) dye which must at least possess the following properties:

1) In a composition comprising a polymerizable substance dispersed in a water-soluble binder, the color image-forming substance exhibits lipophilicity and is contained in the polymerizable substance;

2) The color image-forming substance doesn't drastically inhibit the polymerization of the polymerizable compound in the exposed portions; and 3) During the treatment with an alkaline aqueous solution, the color image-forming substance readily becomes hydrophilic to be eluted from the uncured polymerizable compound into a water phase while it is not eluted from the cured portions. Alternatively, the color image-forming substance readily undergoes a chemical change which causes discoloration in the uncured portions.

So long as it posseses the above mentioned properties, the color image-forming substance may be either an organic compound or an inorganic compound. The color image-forming substance may be dissolved or solid-dispersed in the polymerizable substance.

However, inorganic compounds have a small degree of freedom of molecular design and thus find difficulty in attaining desired properties and characteristics. Therefore, the color image-forming substance to be used in the present invention is preferably an organic compound.

Such an organic compound is not specifically limited. Examples of such an organic compound include various dyes and pigments such as azo dyes, azomethine dyes, azopyrazolone dyes, indoaniline dyes, indophenol dyes, anthraquinone dyes, triarylmethane dyes, alizarin dyes, nitro dyes, quinoline dyes, indigo dyes, phthalocyanine dyes, bisazo dyes, chelate dyes, styryl dyes, thiazine dyes, aminoketone dyes, methine dyes, naphthalimide dyes, benzopyrane dyes, quinoneimine dyes, xanthene dyes, stilbene dyes, triazole dyes, cyanine dyes, and pyridine dyes.

The color image-forming organic dye to be used in the embodiment (a) of the present invention is preferably an organic dye which undergoes reaction and/or dissociation during the treatment with an alkaline aqueous solution to become water-soluble.

In particular, the color image-forming organic dye is preferably an organic dye which contains a dissociative group having a pKa value of 11 or less in the form of its precursor (including conjugate acid) and undergoes washing with an alkaline aqueous solution to produce at least one dissociative group and become water-soluble.

Examples of such a dissociative group include $-COO^{\ominus}$, $-PO_3^{\ominus}$, $-SO_3^{\ominus}$, $-SO_2N^{\ominus}$, $-SO_2^{\ominus}$, $-C^{\ominus}-$, $-SO_2^{\ominus}CO-$, $-NHCOO^{\ominus}$, $-O^{\ominus}$, and $-S^{\ominus}$.

Therefore, in the photopolymerizable composition before exposure, these dissociative groups are in the form of a precursor by which a conjugate acid structure thereof is protected or optionally in a dissociative form but is water-insoluble like a pigment. During the treatment after polymerization, these dissociative groups undergo deprotection reaction and/or deprotonization reaction (dissociation). The dissociative groups thus released make the dyes water-soluble. The dyes are then eluted into the processing solution.

In order to readily produce the above mentioned dissociative groups in the deprotection process, any reaction (e.g., hydrolysis reaction, substitution reaction, elimination reaction, oxidation reaction, reduction reaction) can be used. However, it is necessary to provide a molecular design which realizes both preservation stability and reaction activity during treatment, Explaining with reference to carboxylic acids, the conjugate acid is $-COOH$, and as protective groups and deprotection reactions there can be used those described in T. W. Greene, "Protective Groups in Organic Synthesis", 1981, John Wiley & Sons, Inc., Chapter 5 (Protection for the carboxyl group), p. 152. Therefore, after the polymerization takes place imagewise, and then the deprotection reaction proceeds except for alkali, the conjugate acid of the dissociative groups produced by the treatment with an alkali can be dissociated and eluted into an aqueous solution.

Particularly preferred among these dissociative groups are $-COO^{\ominus}$, $-SO_2N^{\ominus}$, and $-O^{\ominus}$, which satisfy the desired degree of freedom of molecular design and the properties required for dyes. Furthermore, in order to render the color image-forming dye easily washable with an alkaline aqueous solution, it is most preferred to incorporate carboxyl groups ($-COOH$) into the color image-forming dye.

Specific examples of the color image-forming dye to be used in the embodiment (a) of the present invention will be set forth below, but the present invention should not be construed as being limited thereto.

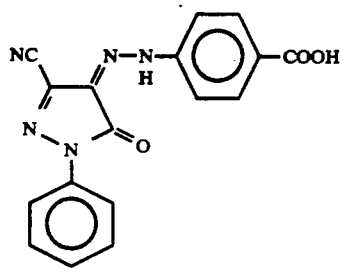

(a)-1

-continued
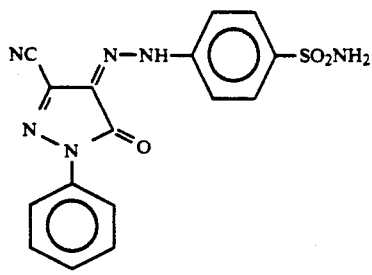
(a)-2
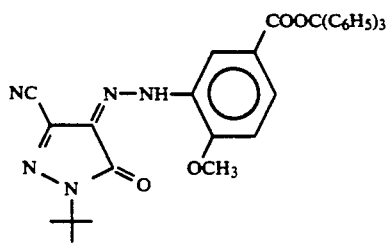
(a)-3
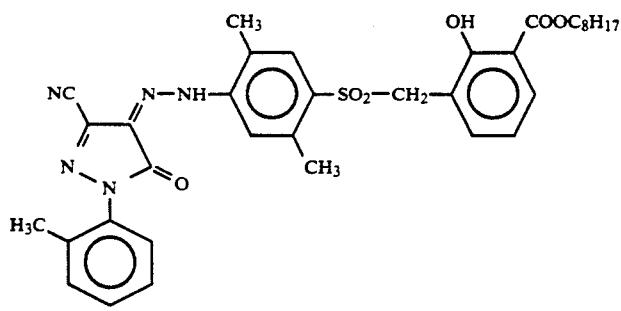
(a)-4
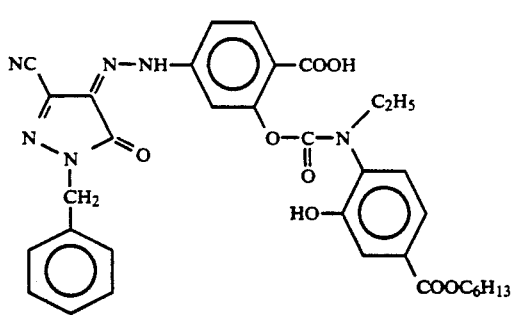
(a)-5
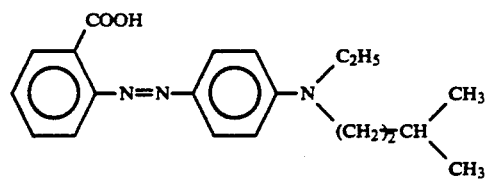
(a)-6
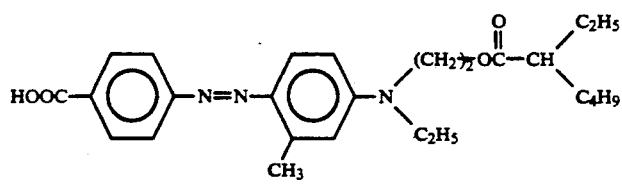
(a)-7

-continued
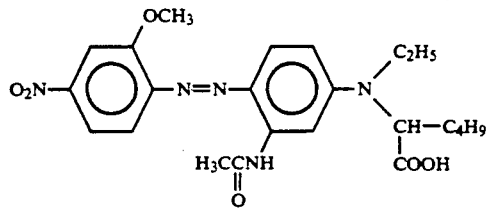
(a)-8
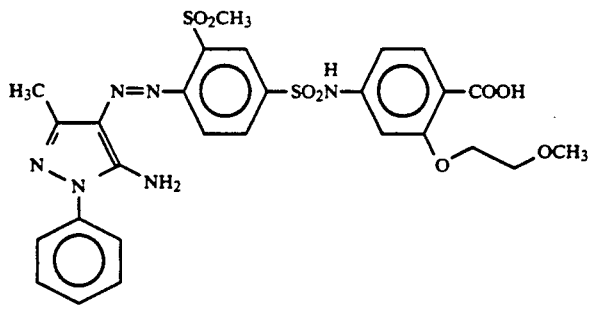
(a)-9
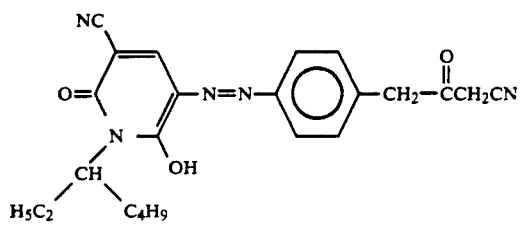
(a)-10
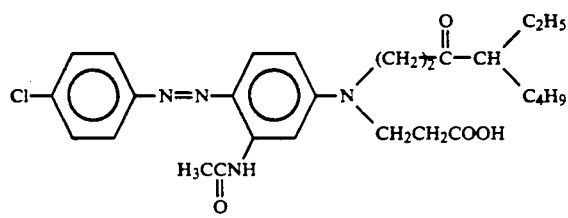
(a)-11
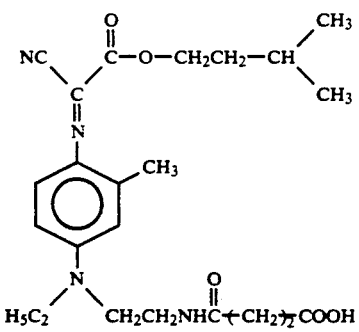
(a)-12
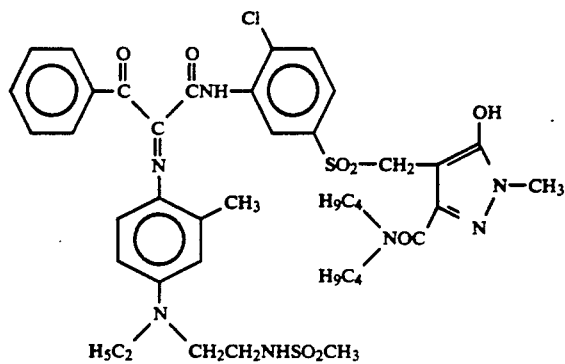
(a)-13

-continued
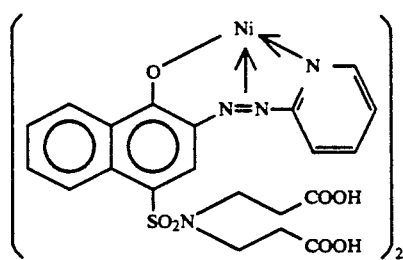
(a)-14
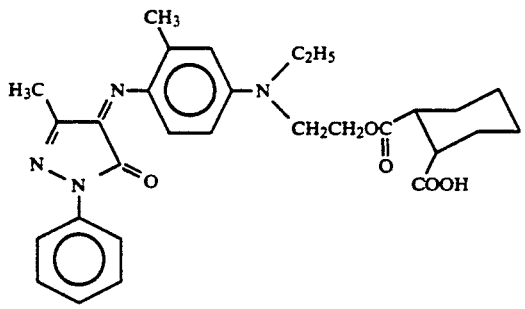
(a)-15
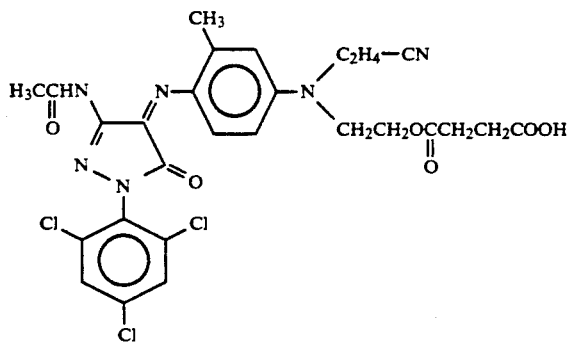
(a)-16
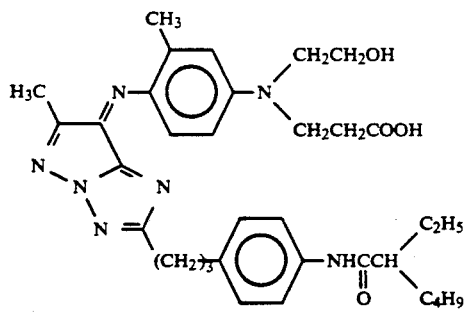
(a)-17
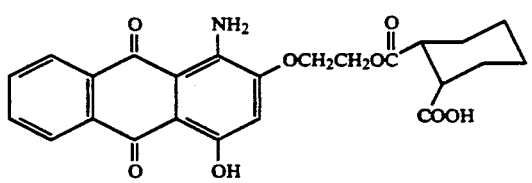
(a)-18
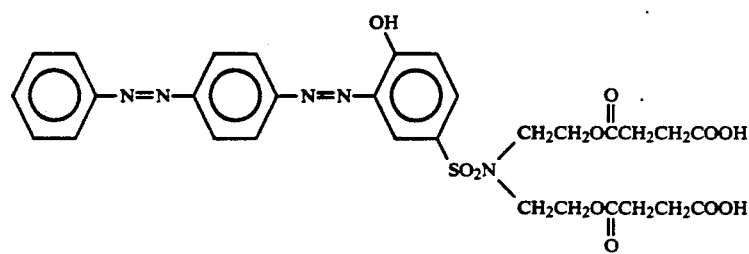
(a)-19

-continued
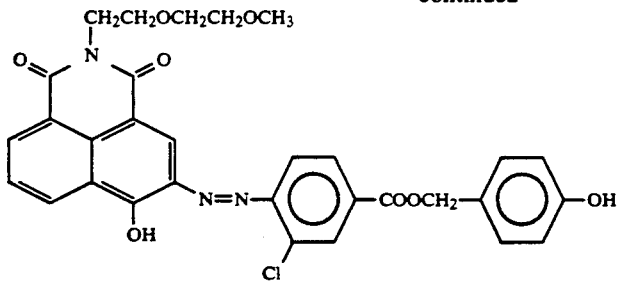 (a)-20
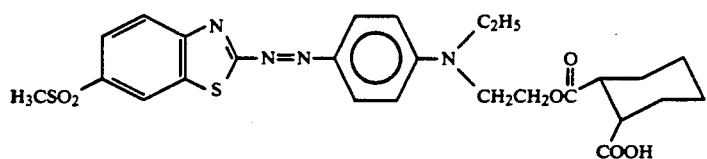 (a)-21
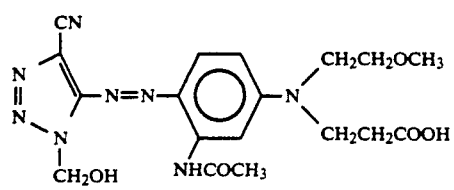 (a)-22
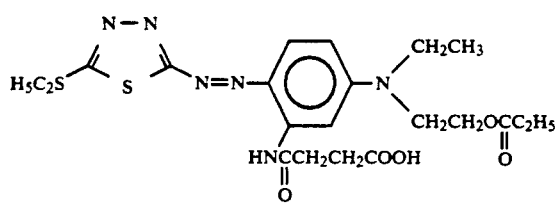 (a)-23
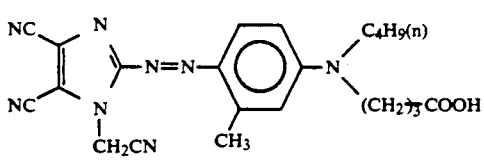 (a)-24
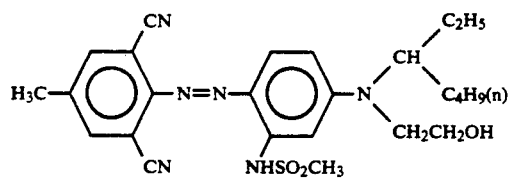 (a)-25
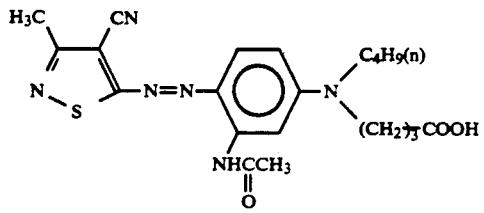 (a)-26
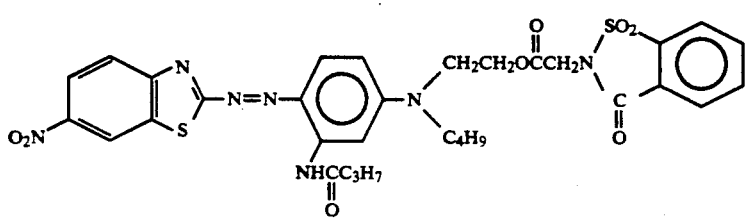 (a)-27

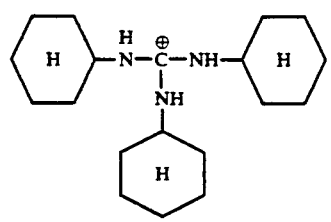
(a)-28
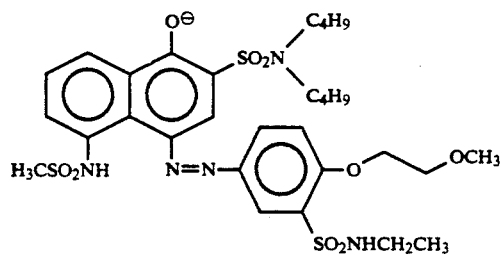
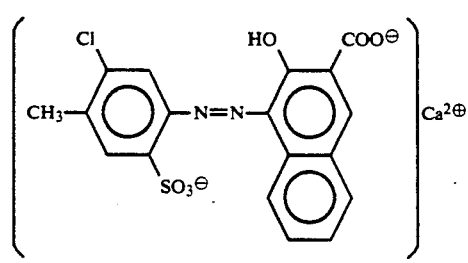
(a)-29
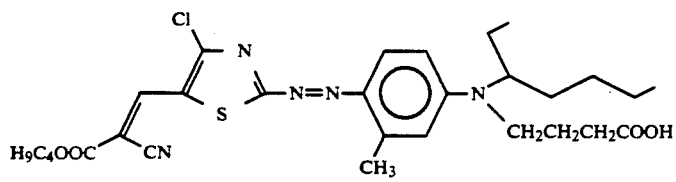
(a)-30
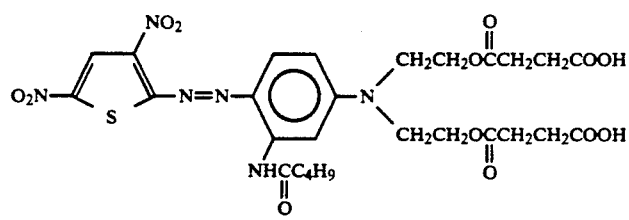
(a)-31
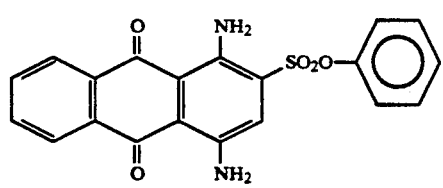
(a)-32
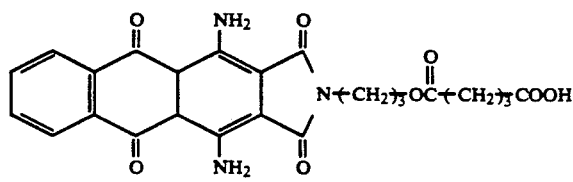
(a)-33

-continued
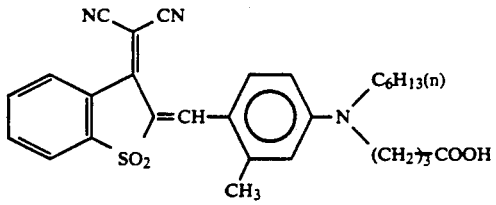
(a)-34
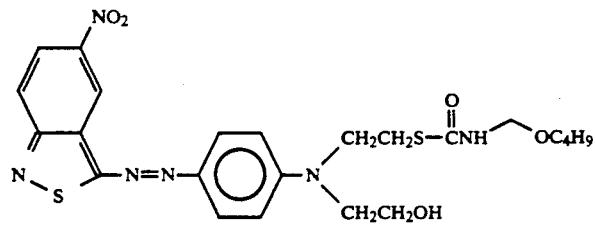
(a)-35
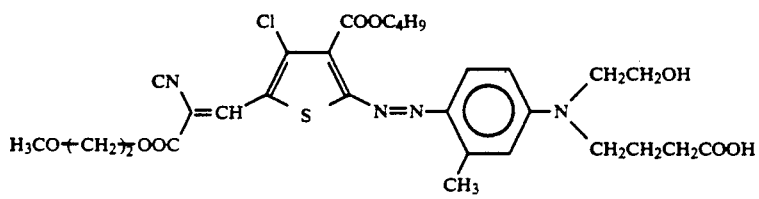
(a)-36
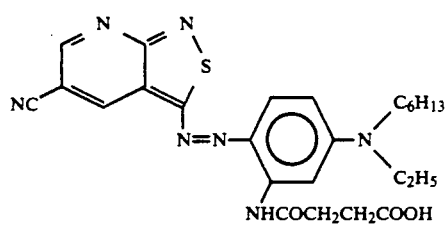
(a)-37
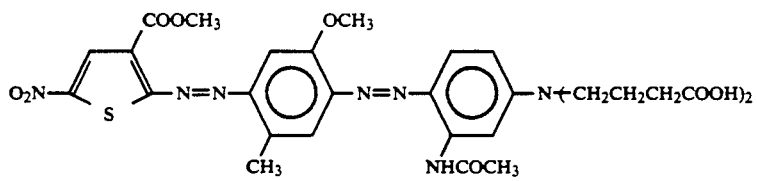
(a)-38
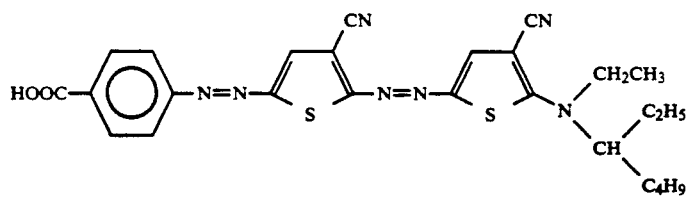
(a)-39
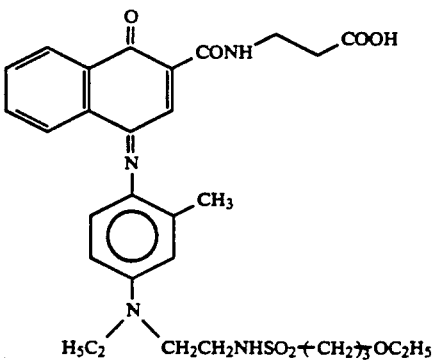
(a)-40

-continued
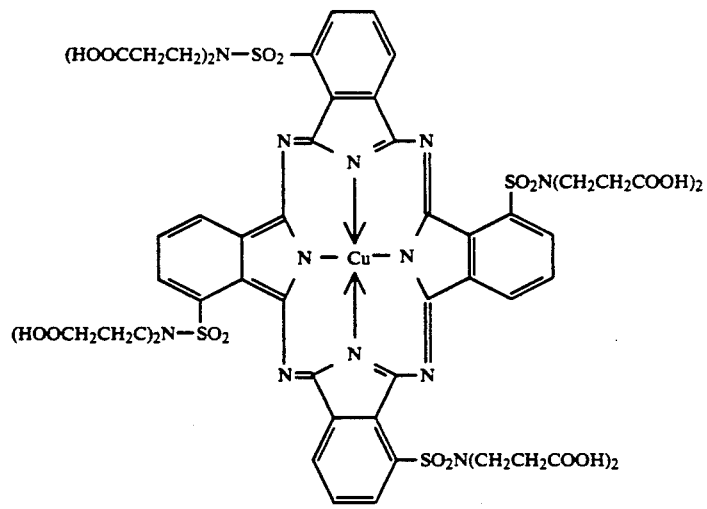
(a)-41
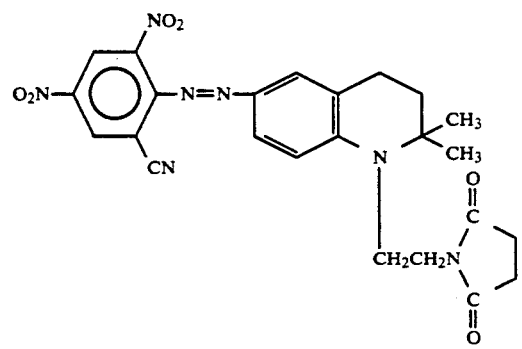
(a)-42
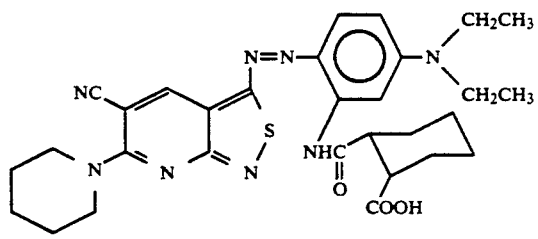
(a)-43
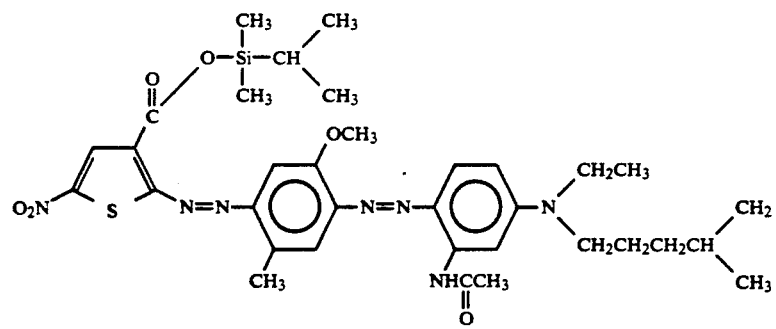
(a)-44
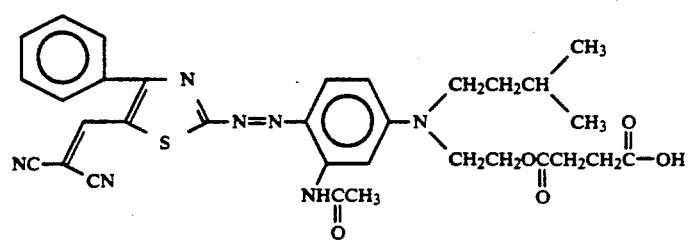
(a)-45

-continued
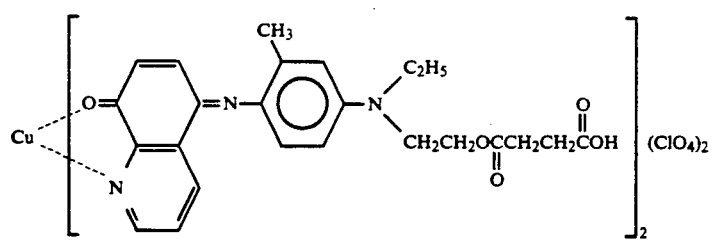 (a)-46
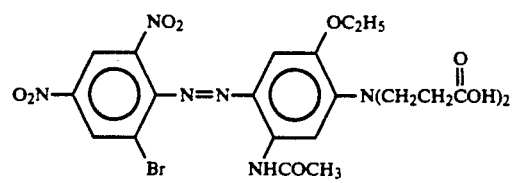 (a)-47
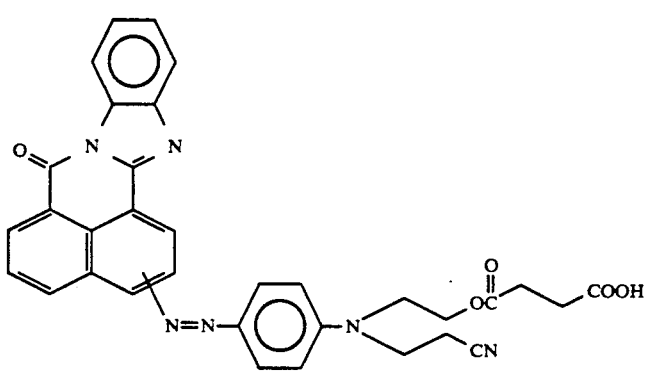 (a)-48
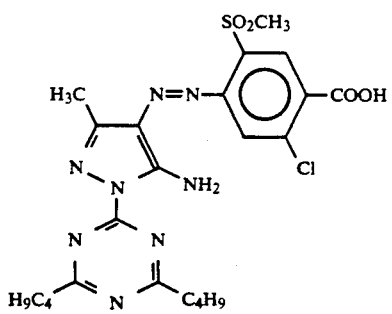 (a)-49
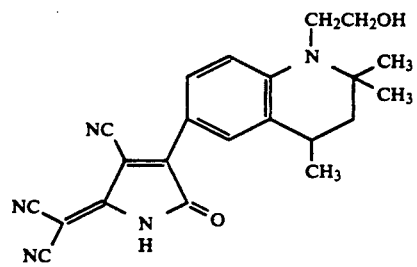 (a)-50
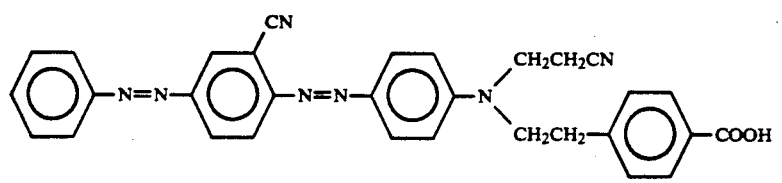 (a)-51

-continued
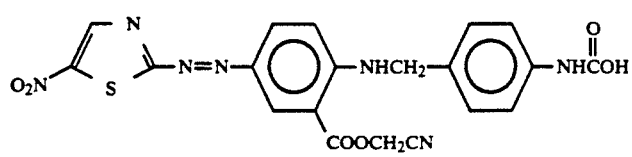
(a)-52
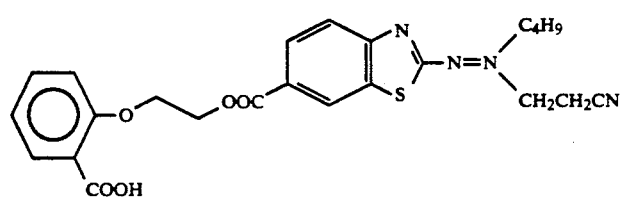
(a)-53
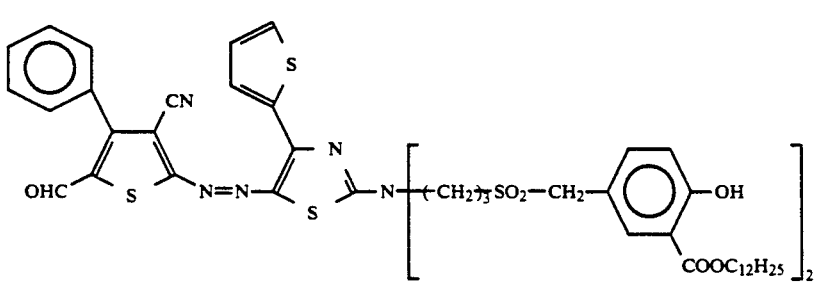
(a)-54
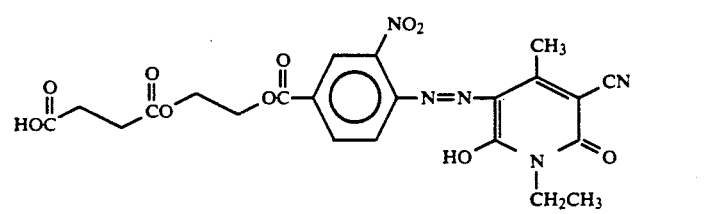
(a)-55
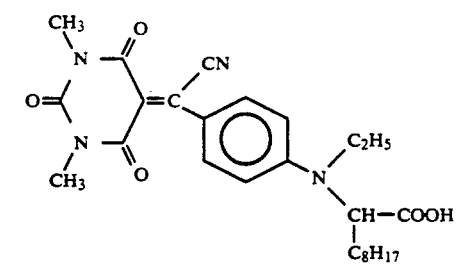
(a)-56
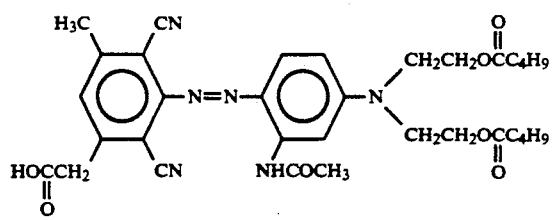
(a)-57
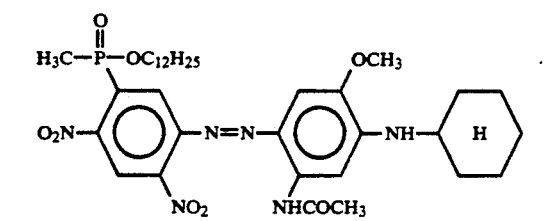
(a)-58

(a)-59
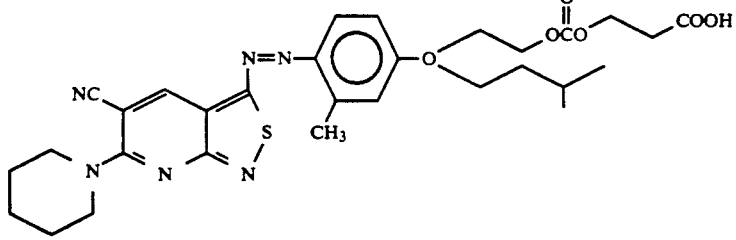
(a)-60
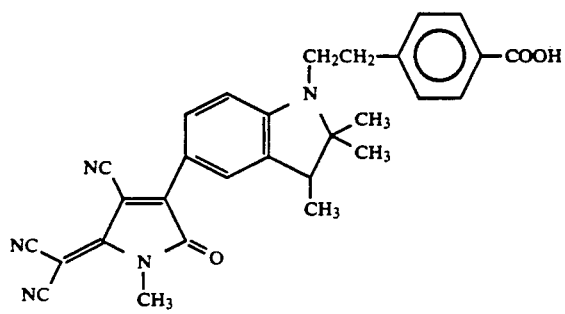
(a)-61
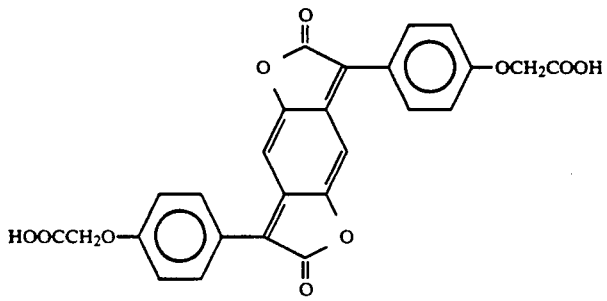
(a)-62
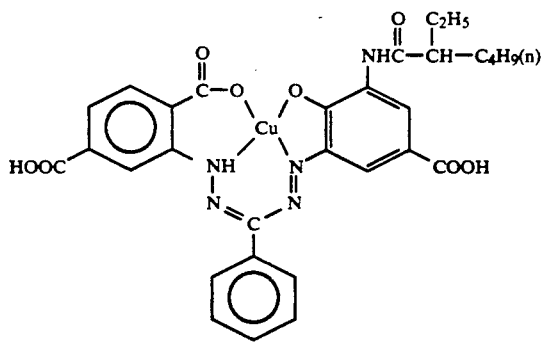
(a)-63
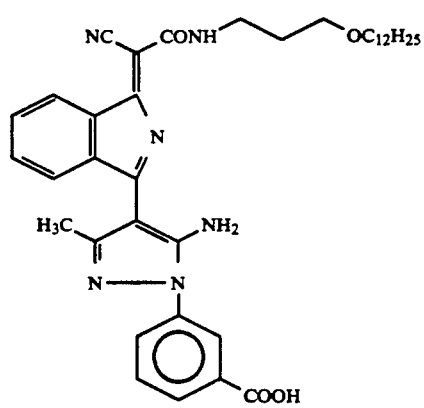

-continued
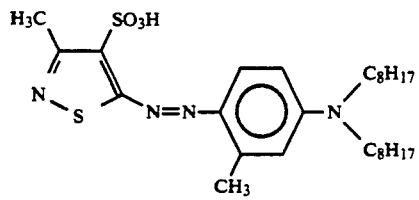
(a)-64
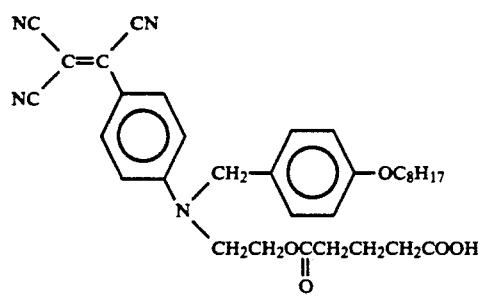
(a)-65
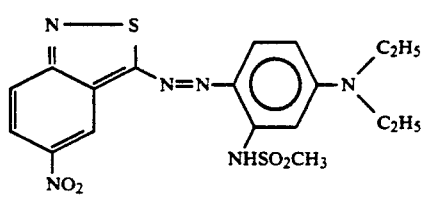
(a)-66
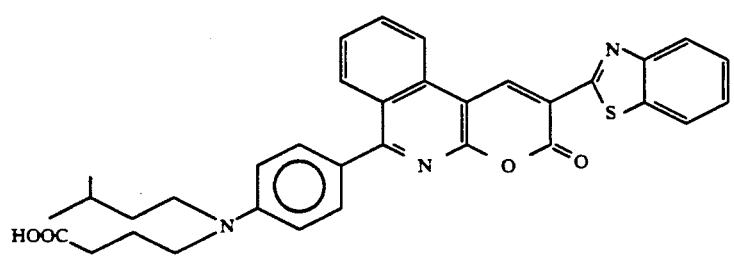
(a)-67
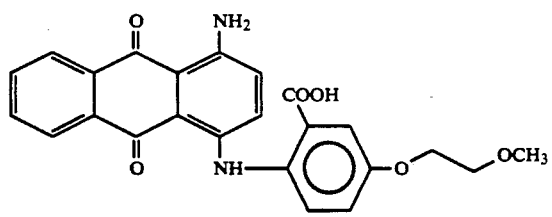
(a)-68
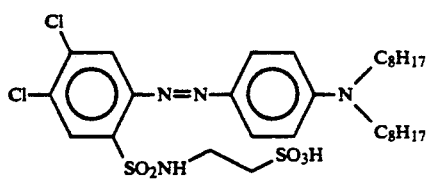
(a)-69
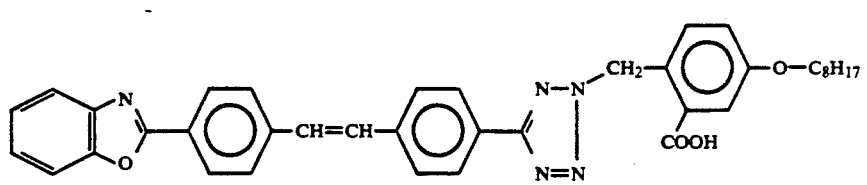
(a)-70

-continued
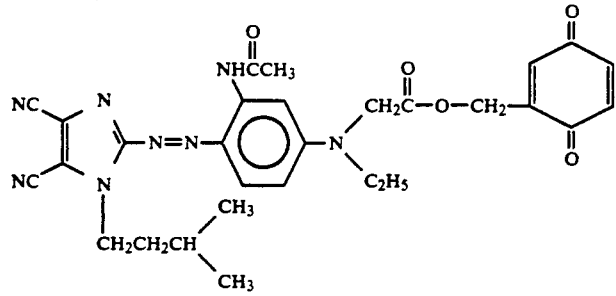
(a)-71
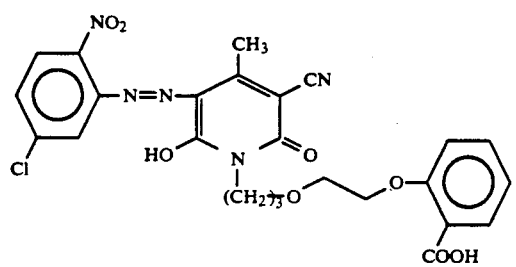
(a)-72
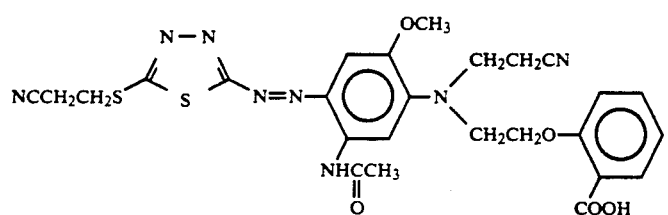
(a)-73
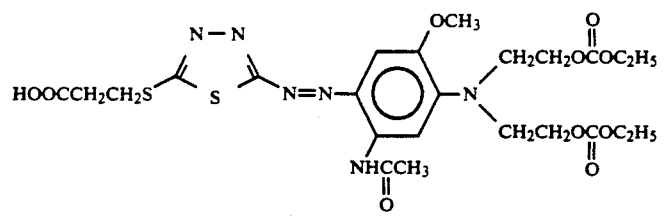
(a)-74
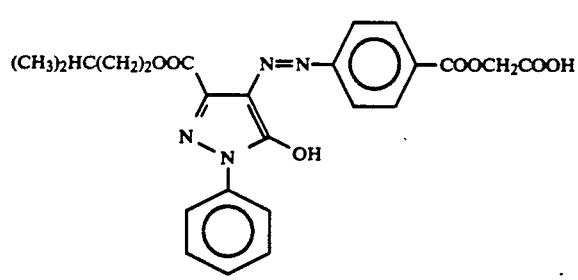
(a)-75
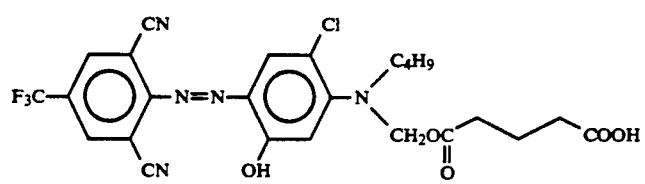
(a)-76

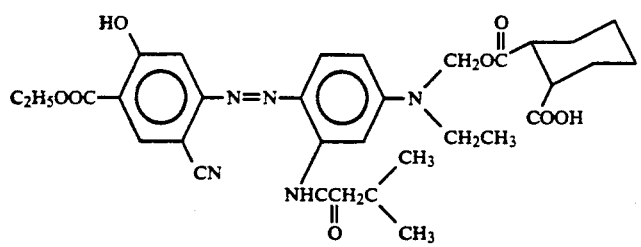
(a)-77
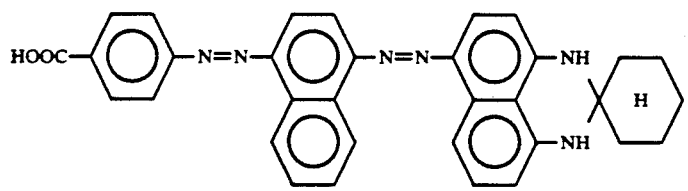
(a)-78
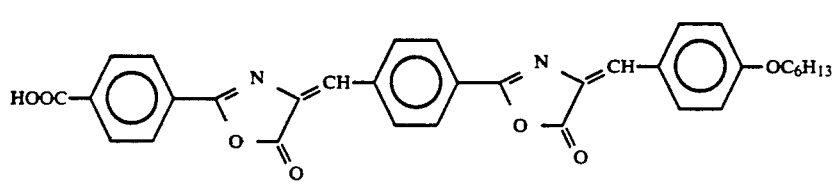
(a)-79
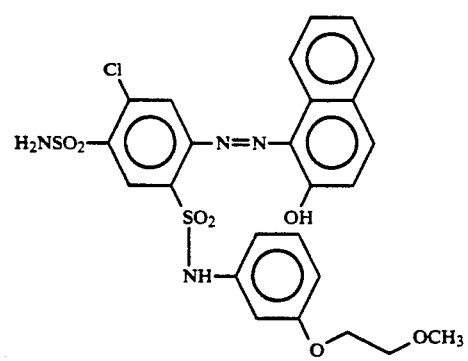
(a)-80
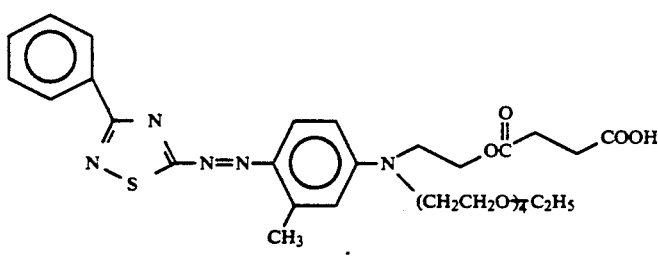
(a)-81
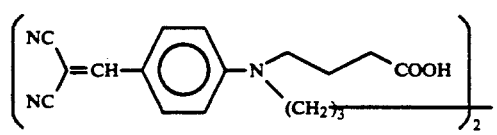
(a)-82
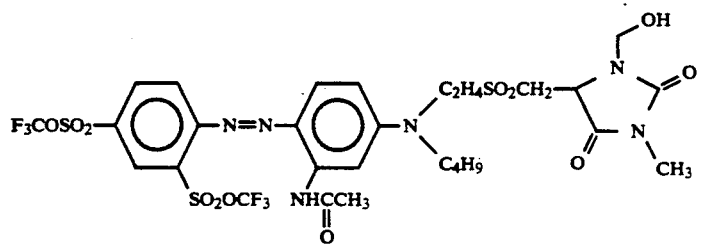
(a)-83

-continued
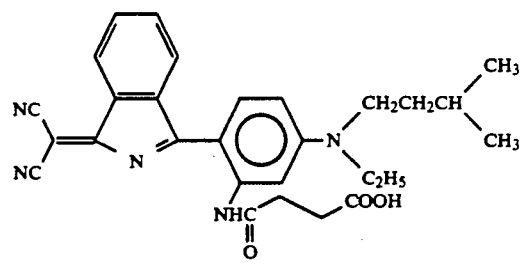
(a)-84
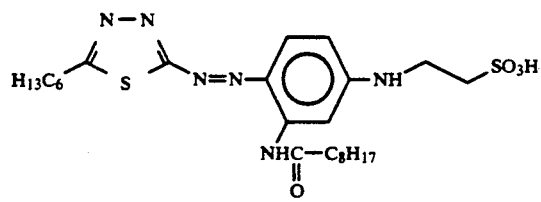
(a)-85
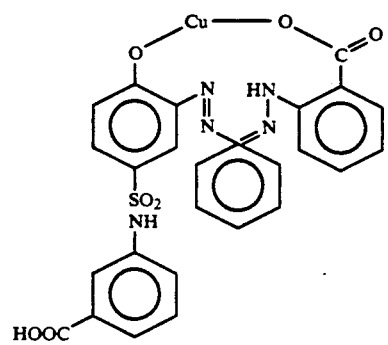
(a)-86
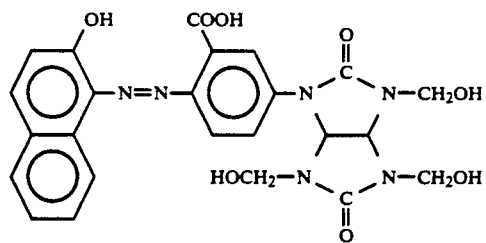
(a)-87
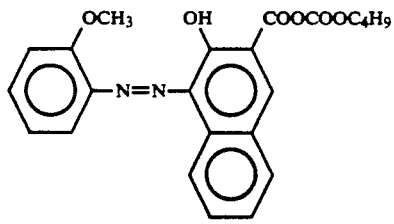
(a)-88
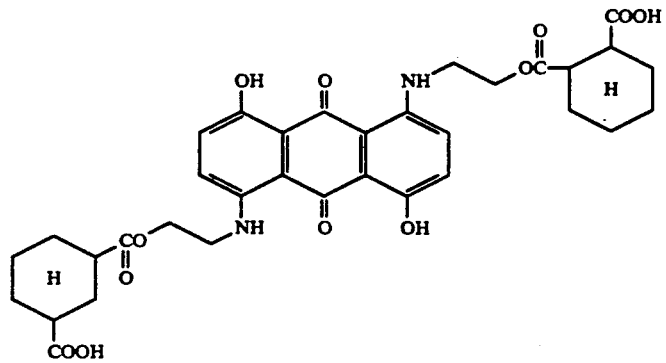
(a)-89

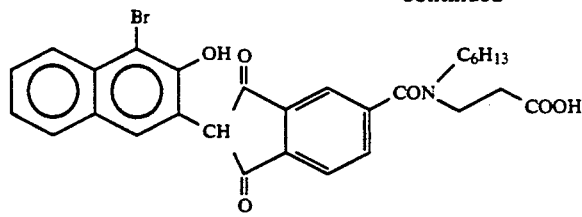
(a)-90
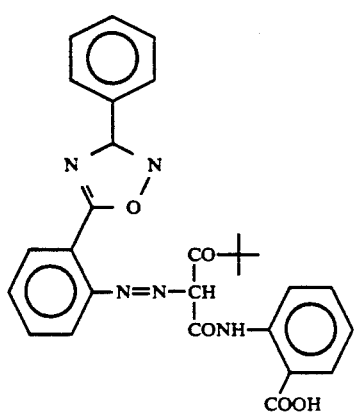
(a)-91
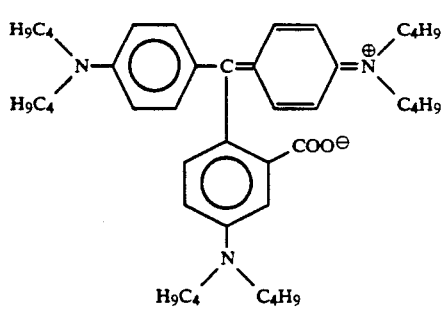
(a)-92
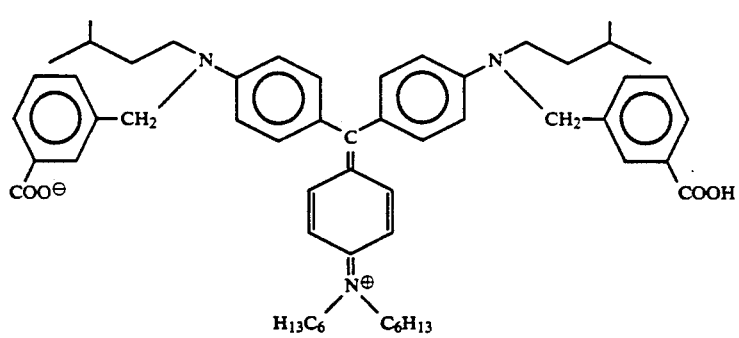
(a)-93
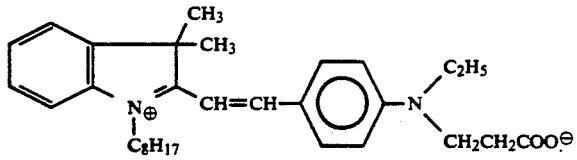
(a)-94
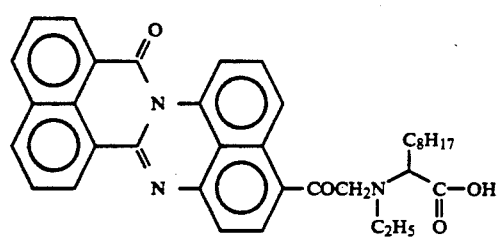
(a)-95

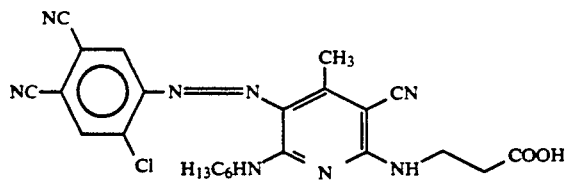
(a)-96
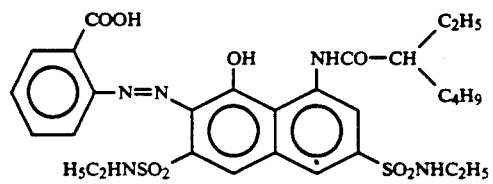
(a)-97
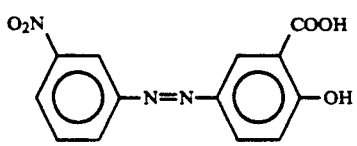
(a)-98
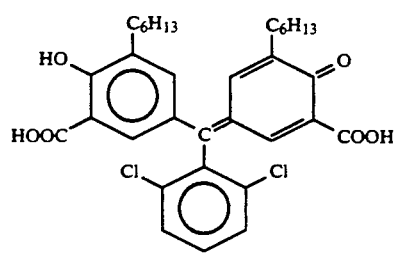
(a)-99
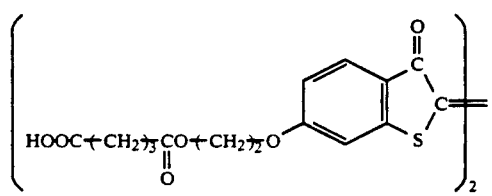
(a)-100
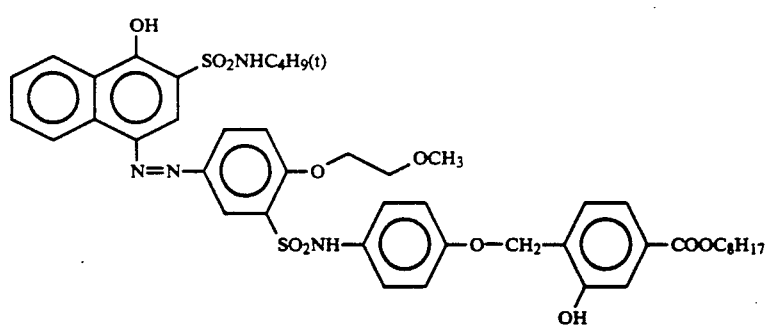
(a)-101
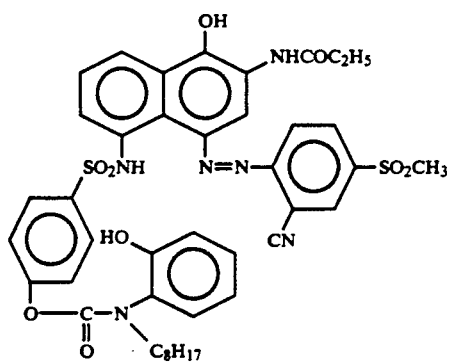
(a)-102

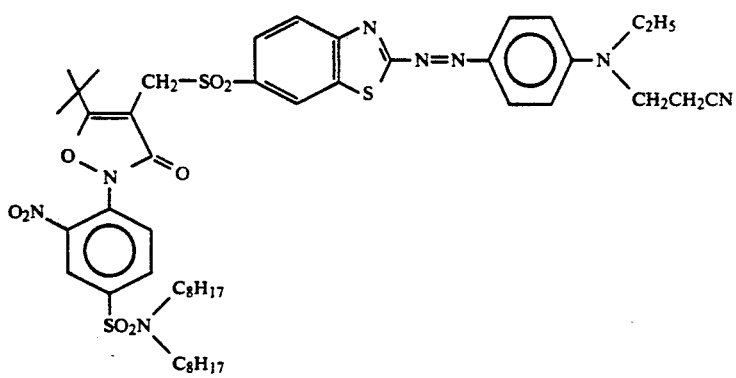

(a)-103

The color image-forming organic dye to be used in the embodiment (b) of the present invention needs to undergo a chemical reaction in the discoloration process which causes a ready discoloration under mild conditions. Typical examples of dye discoloration reaction will be set forth below:

1. Discoloration by reduction of azo group

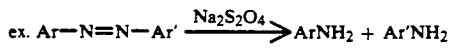

An azo group is reduced by a sulfur-containing reducing compound such as hydrogen sulfide and salts thereof, and sodium hydrosulfite Rongalite, or stannous salts such as stannous chloride and then discolors with a hydrazine or amine.

2. Discoloration by addition to azo group

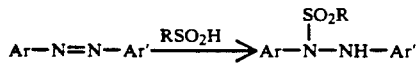

This is discoloration by the addition of sulfinic acid or the like to an azo group.

3. Discoloration by ring closure reaction of triarylmethane dye

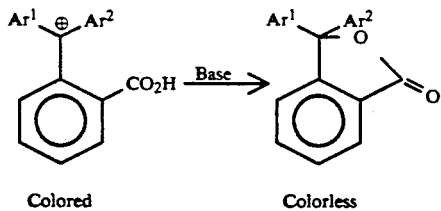

Colored          Colorless

4. Discoloration by hydrolysis of azomethine dye

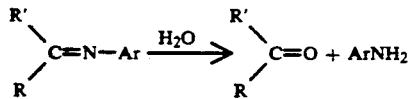

(Acid or base catalyst)

5. Discoloration by reaction of anthraquinone or indigold dye

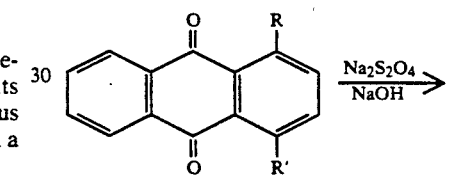

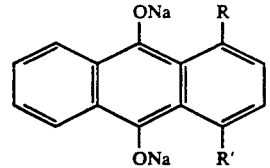

Besides these methods, dye discoloration can be effected by subjecting a chromophore to various chemical changes in the present invention. Particularly preferred among these methods is the discoloration by reduction of azo dyes. Azo dyes are generally excellent in fastness. Azo dyes can vary the hue from yellow to cyan. Furthermore, azo dyes can be easily reduced under mild conditions in the discoloration reaction.

The reduction of an azo group can be accomplished by the use of any suitable reducing agent as processing solution. Sodium hydrosulfite is particularly preferred in the light of ease of handling, environmental safety concerning odor and irritation, and reaction mildness.

Specific examples of the color image-forming substance to be used in the embodiment (b) of the present invention will be set forth hereinafter, but the present invention should not be construed as being limited thereto.

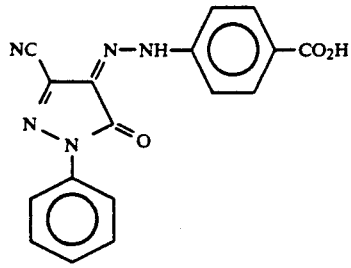 (b)-1.
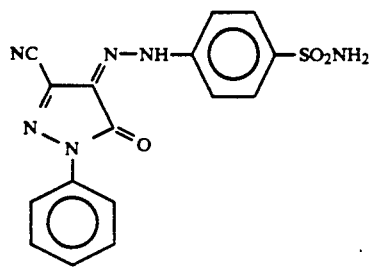 (b)-2.
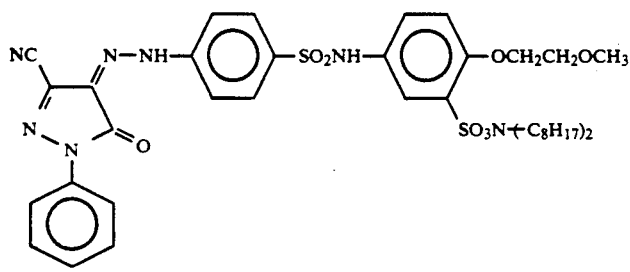 (b)-3.
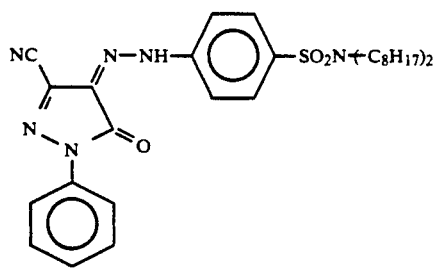 (b)-4.
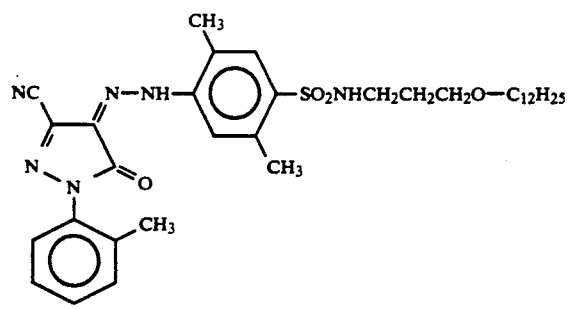 (b)-5.
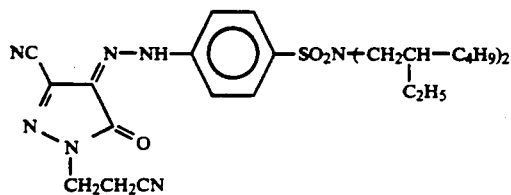 (b)-6.

-continued
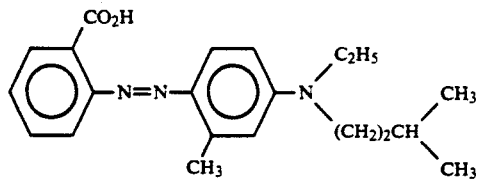
(b)-7.
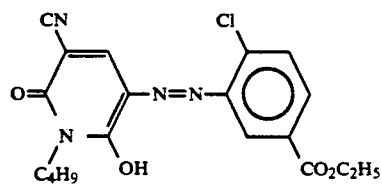
(b)-8.
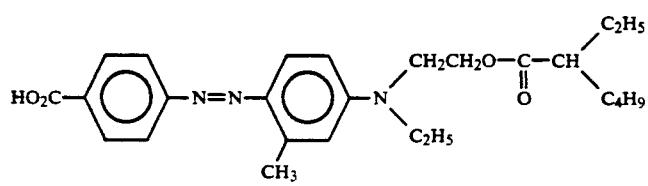
(b)-9.
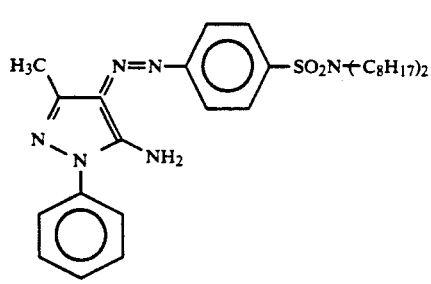
(b)-10.
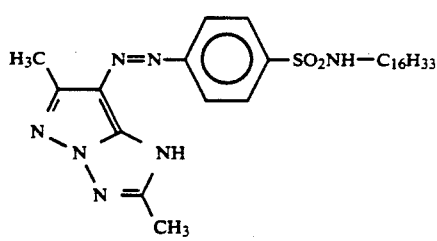
(b)-11.
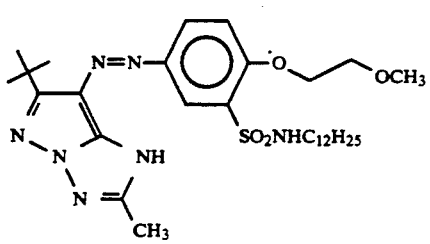
(b)-12.
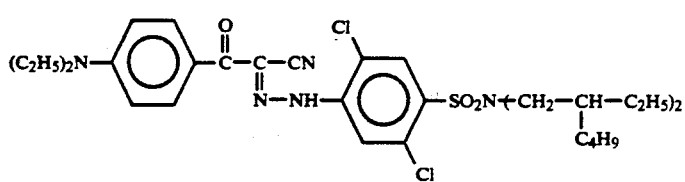
(b)-13.

-continued
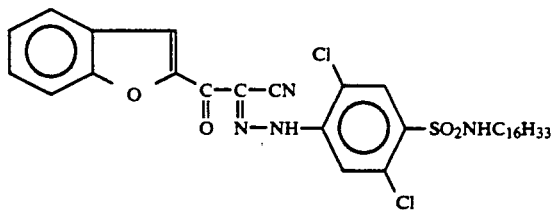
(b)-14.
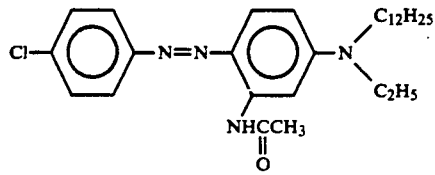
(b)-17.
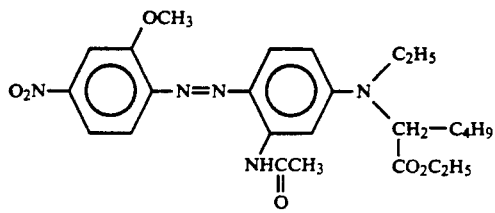
(b)-18.
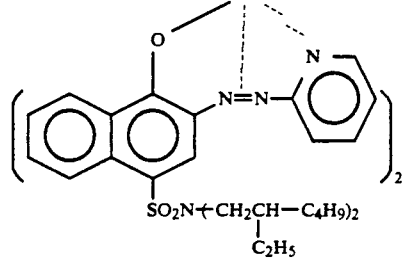
(b)-19.
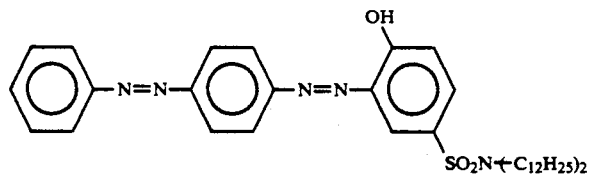
(b)-20.
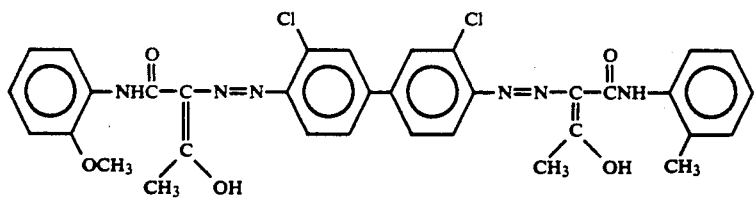
(b)-21.
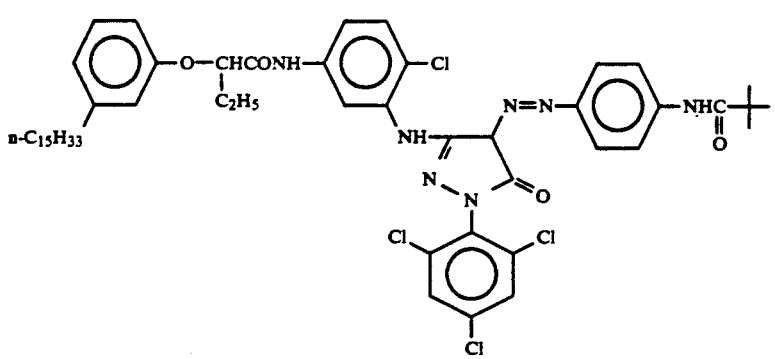
(b)-22.

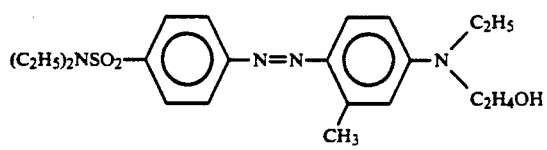
(b)-23.
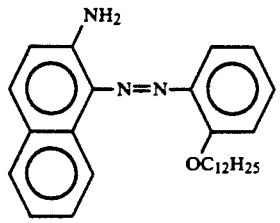
(b)-24.
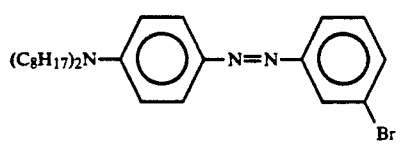
(b)-25.
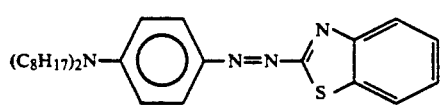
(b)-26.
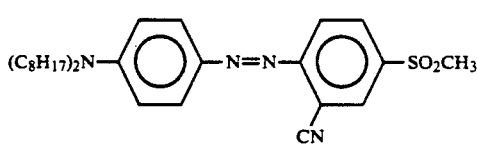
(b)-27.
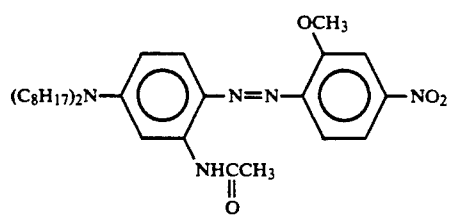
(b)-28.
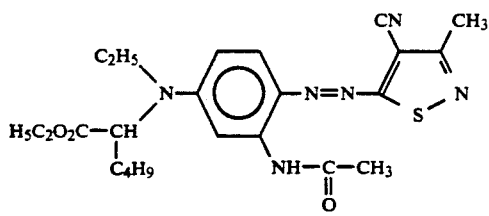
(b)-29.
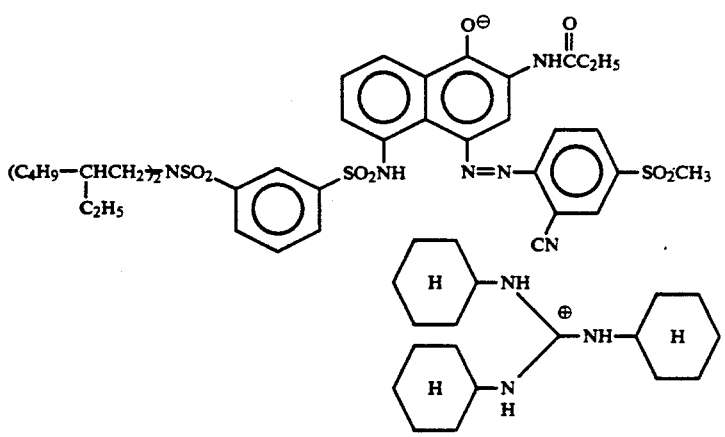
(b)-30.

-continued
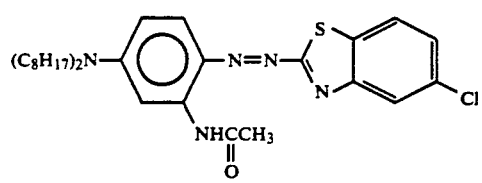
(b)-31.
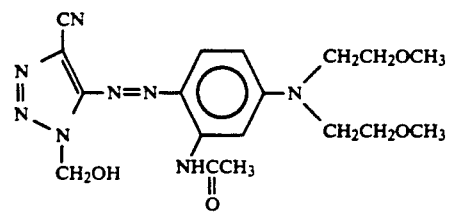
(b)-32.
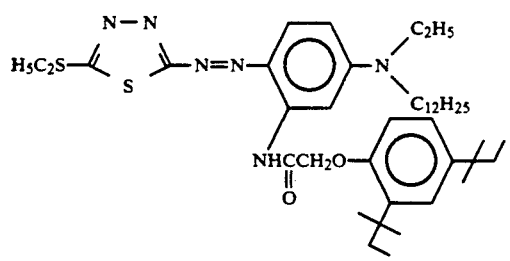
(b)-33.
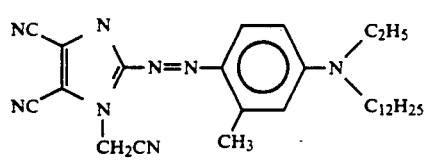
(b)-34.
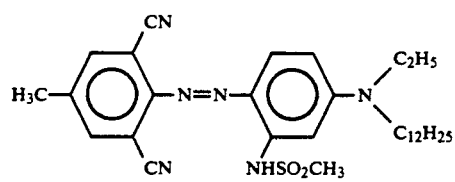
(b)-35.
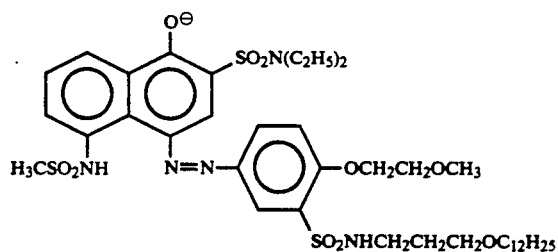
(b)-36.
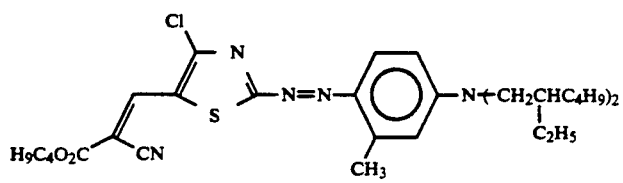
(b)-37.

(b)-38.
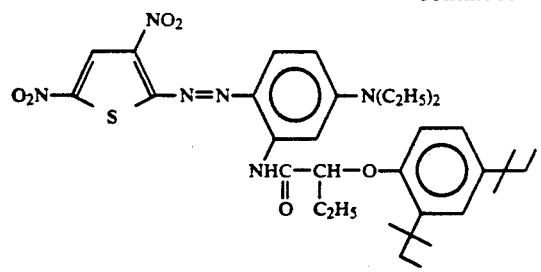
(b)-39.
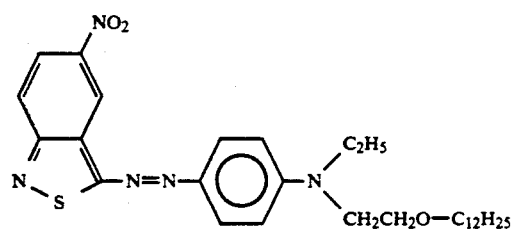
(b)-40.
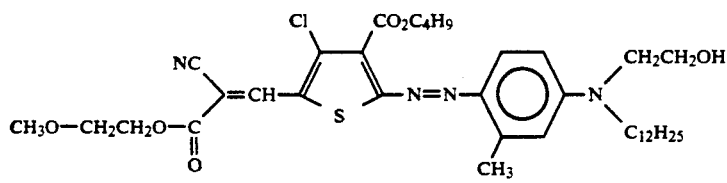
(b)-41.
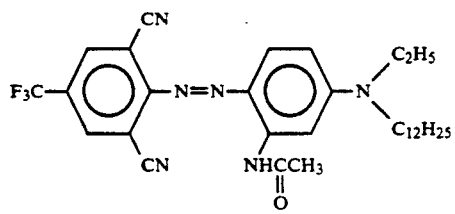
(b)-42.
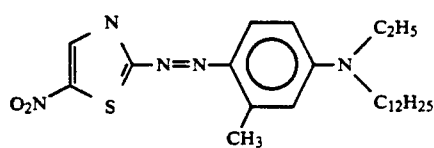
(b)-43.
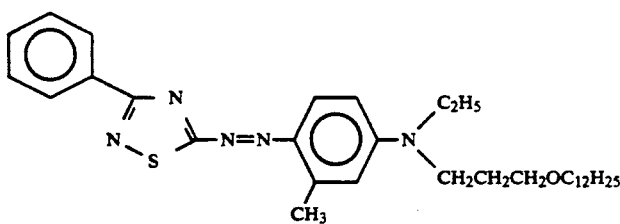
(b)-44.
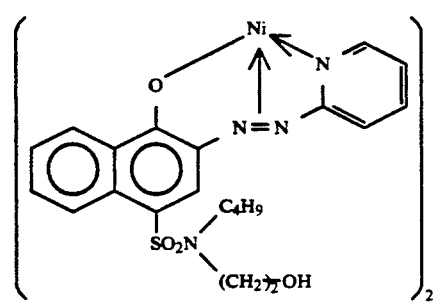

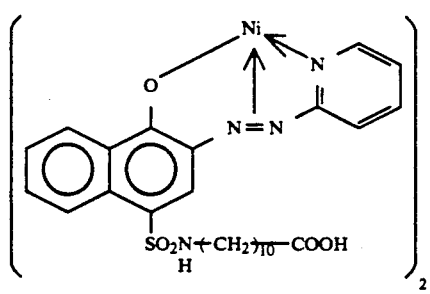
(b)-45.
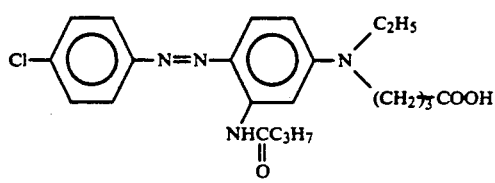
(b)-46.
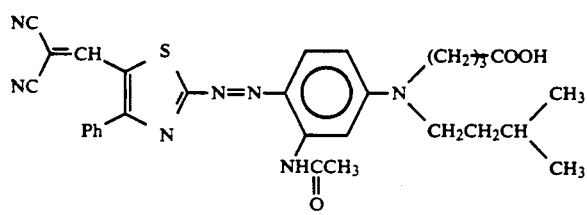
(b)-47.
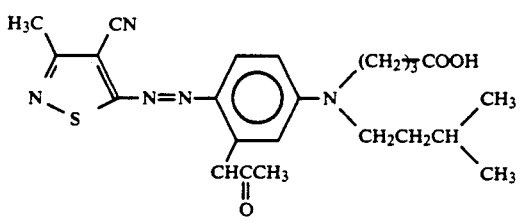
(b)-48.
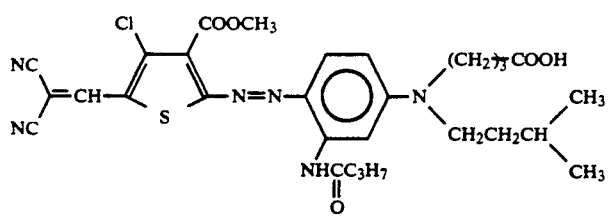
(b)-49.
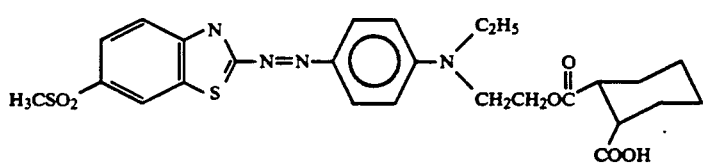
(b)-50.
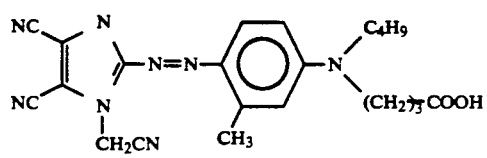
(b)-51.

-continued
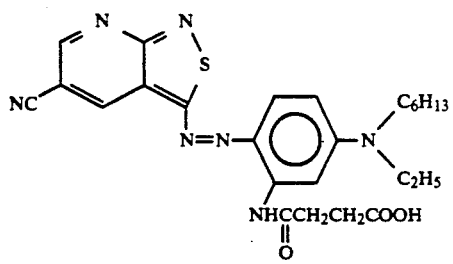 (b)-52.
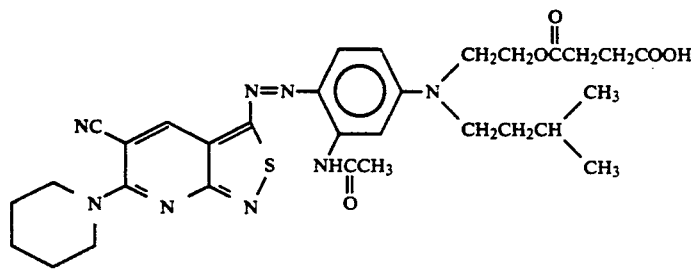 (b)-53.
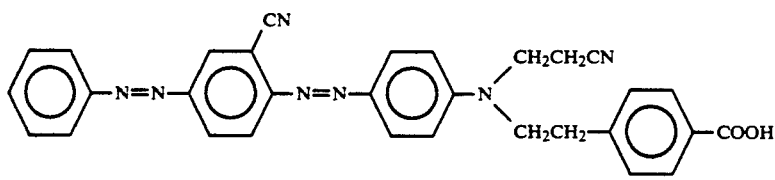 (b)-54.
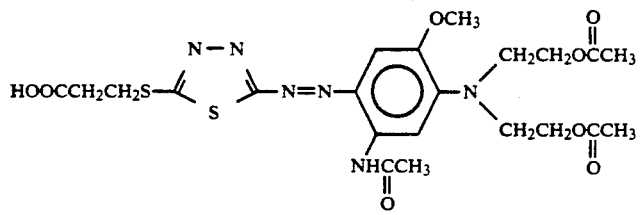 (b)-55.
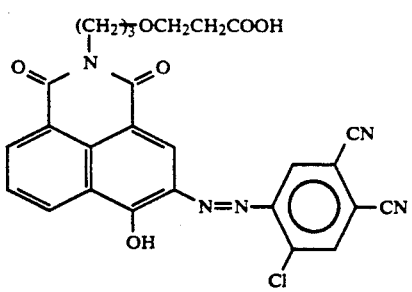 (b)-56.
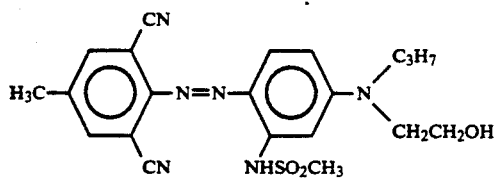 (b)-57.
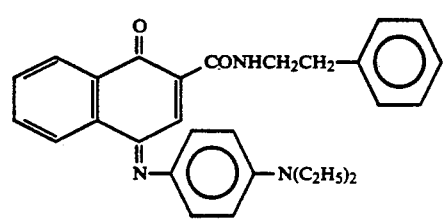 (b)-58.

-continued

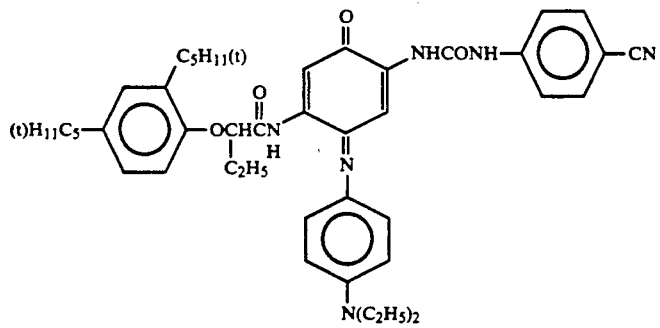 (b)-59.

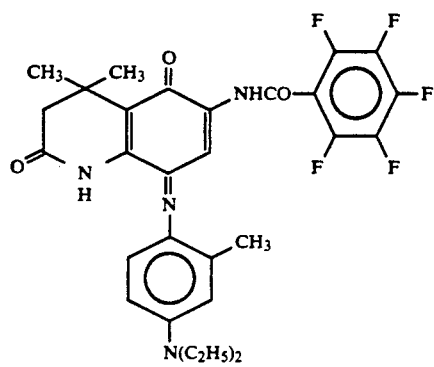 (b)-60.

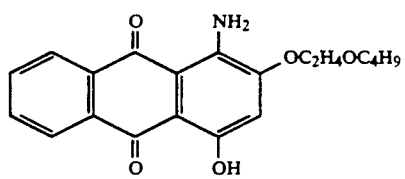 (b)-61.

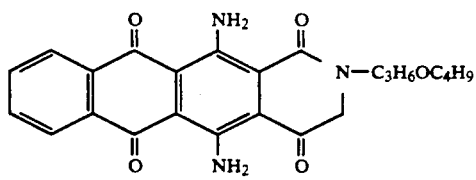 (b)-62.

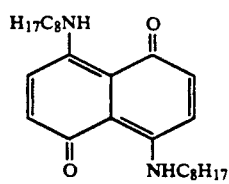 (b)-63.

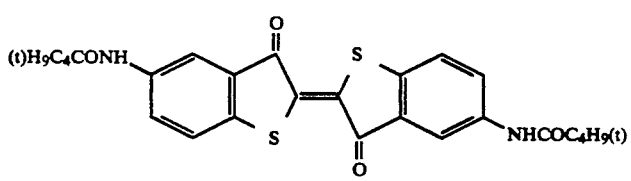 (b)-64.

The present polymerizable compound will be further described hereinafter.

Examples of the polymerizable compound which can be used in the present invention include addition-polymerizable monomers, and oligomers and polymers thereof. As such addition-polymerizable monomers there can be used compounds containing one or more carbon-carbon unsaturated bonds. Examples of these compounds include acrylic acid and salts thereof, acrylic esters, acrylamides, methacrylic acid and salts thereof, methacrylic esters, methacrylamides, maleic anhydride, maleic esters, itaconic esters, styrenes, vinyl ethers, vinyl esters, N-vinyl heterocyclic compounds, and derivatives thereof.

These compounds are all known in the art and useful in the present invention. These compounds preferably exhibit a proper hydrophobicity (lipophilicity) required for dispersion in a water-soluble binder.

Preferred examples of polymerizable compounds which can be used in the present invention include acrylic acid, methacrylic acid, butyl acrylate, methoxyethyl acrylate, butyl methacrylate, acrylamide, N,N-dimethylacrylamide, N,N-diethylacrylamide, N-acryloylmorpholine, N-acryloylpiperidine, glycidyl acrylate, 2-ethylhexyl acrylate, acrylic anilide, methacrylic anilide, styrene, vinyltoluene, chlorostyrene, methoxystyrene, chloromethylstyrene, 1-vinyl-2-methylimidazole, 1-vinyl-2-undecylimidazole, 1-vinyl-2-undecylimidazoline, N-vinylpyrrolidone, N-vinylcarbazole, vinyl benzyl ether, and vinyl phenyl ether.

In order to improve the S/N ratio of color images obtained, there is preferably incorporated a cross-linkable compound having an effect of improving the viscosity or degree of cure of high-molecular weight compounds produced from these polymerizable compounds in combination therewith. The term "cross-linkable compound" as used herein means a so-called polyfunctional monomer containing a plurality of vinyl of vinylidene groups in its molecule.

In the present invention, a particularly preferred cross-linkable compound is a compound containing two or more vinyl groups in its molecule. Such a compound can be used in combination with the present polymerizable compound. Alternatively, compounds containing a plurality of such vinyl groups can be preferably used, singly or in combination.

Examples of such compounds include methylenebisacryamide, trimethylene-bisacrylamide, hexamethylenebisacrylamide, N,N'-diacryloylpiperazine, m-phenylenebisacrylamide, p-phenylene-bisacrylamide, ethylene glycol diacrylate, propylene glycol dimethacrylate, diethylene glycol diacrylate, polyethylene glycol diacrylate, bis(4-acryloxypolyethoxyphenyl)propane, 1,5-pentanediol diacrylate, neopentyl glycol diacrylate, 1,6-hexanediol diacrylate, polypropylene glycol diacrylate, pentaerythritol triacrylate, trimethylolpropane triacrylate, pentaerythritol tetraacrylate, N-methylolacrylamide, diacetone acrylamide, and triethylene glycol dimethacrylate.

Other examples of these compounds include prepolymers such as oligomers, i.e., polyester acrylates (or oligoester acrylates) produced by the reaction of acrylic acid and hydroxyl residue of polyester produced by the condensation of polybasic acid (e.g., phthalic acid, isophthalic acid, terephthalic acid, maleic acid, fumaric acid, malonic acid, succinic acid, adipic acid) and polyvhydric alcohol (e.g., ethylene glycol, propylene glycol, polyethylene glycol, polypropylene glycol, glycerin, trimethylolpropane, trimethylolethane, pentaerythritol) as described in JP-B-52-7361 (the term "JP-B" as used herein means an "examined Japanese patent publication"), polyurethane acrylates obtained by the reaction of acrylic esters containing hydroxyl groups and isocyanates as described in JP-B-48-4170, and epoxy acrylates.

The present photopolymerization initiators will be further described hereinafter.

In the present invention, various photopolymerization initiators can be used. By the type of polymerization reaction, photopolymerization initiators are roughly divided into two main groups: radical polymerization initiator and cationic polymerization initiator. The type of polymerization reaction is selected depending on the purpose and usage. Accordingly, the type of polymerizable compounds to be used in the polymerization reaction thus selected must be properly selected. In radical polymerization, various acrylates and methacrylates or unsaturated polyesters are used. In cationic polymerization, epoxy compounds or vinyl ethers are used.

Radical photopolymerization initiators are further described in Oster et al., "Chemical Review", vol. 68, pp. 125 to 151, 1968, and Kosar, "Light-Sensitive Systems:, pp. 158 to 193, John Wiley & Sons, 1965. By the radical production mechanism, radical photopolymerization initiators are roughly divided into three types: (1) direct cleavage type, (2) hydrogen abstraction type, and (3) binary system type. Radical photopolymerization initiators of the direct cleavage type undergo $\alpha$, $\beta$ or $\gamma$ cleavage or cleavage of Norrish I or II type upon light excitation to produce radicals. Typical examples of such radical photopolymerization initiators include benzoinethers, benzylketals, $\alpha$-hydroxyacetophenones, trihaloacetophenones, $\alpha$-aminoacetophenones, acylphosphine oxide, $\alpha$-dicarbonyl compounds, and $\alpha$-acyloxime esters. In radical photopolymerization initiators of the hydrogen abstraction type, triplets produced by the excitation of aromatic ketones undergo hydrogen abstraction reaction to abstract hydrogen from hydrogen donors and produce radicals. Typical examples of such radical photopolymerization initiators include combinations of aromatic ketones and amines, thioxanthones and hydrogen donors, anthraquinones and hydrogen donors, and Michler's ketones. The most typical examples of such hydrogen donors are aromatic amines. Other useful examples of such hydrogen donors include alcohols and alkylbenzoates. Radical photopolymerization initiators of the binary system type consist of two types of compounds. When one of the two compounds is excited, the two compounds undergo a mutual interaction which causes electron or proton migration, resulting in the production of radicals. There is well known a combination of a sensitizing dye such as xanthene dyes, coumarin dyes, and ketocoumarin dyes and a radical generator such as peroxides and rofins (bisimidazoles). These systems have a great advantage that the sensitive wavelength range can be altered by selecting sensitizing dyes. The migration of electrons from dyes in their excited form enables an efficient radical production. By using a combination of triphenylalkyl borate and cationic dye or a combination of pyrilium salt or diphenyl iodinium salt and anionic dye as described in JP-A-62-150242, a salt is produced between the radical generator and the dye, realizing an efficient initiator. By properly selecting dyes to be used, a high sensitivity panchromatic photopolymerization initiators having a sensitivity to light of up to 740 nm can be obtained. Therefore, the binary system type photopolymerization initiators are particularly useful in the present invention.

Furthermore, N-phenylglycines, phenylthioacetic acids, phenoxyacetic acids and phenylacetic acids can be combined with electron-accepting dyes to provide efficient initiators. These initiators are further described in R. S. Davidson et al., "Chem. Commun", page 1502, 1971, R. S. Davidson et al., "J. Chem. Soc. (C)", page 1682, 1971, and J. L. R. Willams, "Polym. Eng. Sci.", vol. 23, page 1022, 1983.

Moreover, a combination of polyhalogen compound and amine is useful. The most typical example of such a polyhalogen compound is a trichloromethyl triazine. Such a polyhalogen compound can be used in combination with various aromatic amines. Trichloromethyl triazines having an aromatic amine structure in their molecules are useful as high sensitivity photopolymerization initiators. These initiators are further described in Yamaoka et al., "Circuit Technology", vol. 2, page 50, 1987.

Furthermore, a combination of photoreducible dye and reducing agent or hydrogen donor is useful in the present invention because it can be sensitized up to visible range. Typical examples of such a photo-reducible dye include azine dyes such as oxazine, thiazine and phenoxazine dyes, xanthene dyes such as Rose Bengal, Eosin, erythrosine and fluorescein, and acridine dyes such as acriflavine, and Acridine Orange. Useful examples of reducing agents include $\beta$-diketones, amines, sulfinic acid and salts thereof, and ascorbic acid.

On the other hand, cationic photopolymerization initiators produce active species (particularly strong acid) which cause cationic polymerization upon irradiation with light. As compared to radical polymerization initiators, such cationic photopolymerization initiators are extremely limited. The most typical among these cationic photopolymerization initiators are aromatic diazonium salts, aromatic iodonium salts, and aromatic sulfonium salts, all of which are useful in the present invention. These cationic photopolymerization initiators are further described in J. V. Crivrllo et al., "Ann. Rev. Mater. Sci.", vol. 13, page 173, 1983. These photopolymerization initiators can be designed so as to be easily washed off with water during treatment or easily decomposed during post-treatment so that it leaves no color by introducing an alkali-soluble group thereinto or other approaches.

The binder to be used in the present invention will be further described hereinafter.

In the present invention, various binders can be used singly or in combination. As such binders there can be used hydrophilic binders. Typical examples of such hydrophilic binders include transparent or translucent hydrophilic binders. Specific examples of such binders include gelatin. Other hydrophilic binders can be used in the present invention. Examples of such hydrophilic binders include proteins such as gelatin derivatives, graft polymers of gelatin and other high-molecular weight compounds, albumin, and casein, sugar derivatives such as cellulose derivatives (e.g., hydroxyethyl cellulose, carboxymethyl cellulose, cellulose sulfate ester), sodium alginate, and starch derivatives, and synthetic hydrophilic high-molecular weight substances such as homopolymers and copolymers (e.g., polyvinyl alcohol, polyvinyl alcohol partial acetal, poly-N-vinylpyrrolidone, polyacrylic acid, polymethacrylic acid (or polymers obtained by ester bonding of (meth)acrylate to poly(meth)acrylic acid), polyacrylamide, polyvinyl imidazole, and polyvinyl pyrazole.

As gelatin there can be used lime-treated gelatin or acid-treated gelatin. Besides these gelatins, hydrolyzates of gelatin or products of enzymatic decomposition of gelatin can be used. As gelatin derivatives there can be used products of the reaction of gelatin with various compounds such as acid halides, acid anhydrides, isocyanates, bromoacetic acid, alkanesaltones, vinylsulfonamides, maleinimide compounds, polyalkylene oxides, and epoxy compounds. Specific examples of such gelatin derivatives are described in U.S. Pat. Nos. 2,614,928, 3,132,945, 3,186,846, and 3,312,553, British Patent 861,414, 1,033,189, and 1,005,784, and JP-B-42-26845.

Examples of gelatin graft polymers which can be used in the present invention include products of the graft polymerization of gelatin with acrylic acid, methacrylic acid or esters or amides thereof, or homopolymers or copolymers of vinyl monomers such as acrylonitrile and styrene. Particularly preferred are graft polymers of gelatin with polymers having some compatibility therewith, such as acrylic acid, methacrylic acid, acrylamide, methacrylamide and hydroxyalkyl methacrylates. Examples of these graft polymers are described in U.S. Pat. Nos. 2,763,625, 2,831,767, and 2,956,884. Typical examples of synthetic hydrophilic high-molecular weight substances include those described in West German Patent Application (OLS) No. 2,312,708, U.S. Pat. Nos. 3,620,751 and 3,879,205, and JP-B-43-7561.

The present color image recording material can comprise many additives incorporated therein besides the above-mentioned materials as necessary. Typical examples of such additives will be described hereinafter.

Since polymerizable materials are forbidden or inhibited by oxygen to polymerize, an automatic oxidizing agent must be often used effectively.

An automatic oxidizing agent is a compound capable of absorbing oxygen in the free-radical chain reaction process.

A useful example of such an automatic oxidizer is N,N-dialkylaniline as described in JP-A-62-143044. Preferred examples of N,N-dialkylaniline include dialkylanilines obtained by the substitution of one or more of the ortho-, meta- and para-positions of N,N-dialkylaniline by the following groups: methyl, ethyl, isopropyl, t-butyl, 3,4-tetramethylene, phenyl, trifluoromethyl, acetyl, ethoxycarbonyl, carbonyl, carboxylate, trimethylsilylmethyl, trimethylsilyl, triethylsilyl, trimethylgermanium, triethylgermanium, trimethylstannyl, triethylstannyl, n-butoxy, n-pentyloxy, phenoxy, hydroxyl, acetyloxy, methylthio, ethylthio, isopropylthio, thio(mercapto), acetylthio, fluorine, chlorine, bromine, and iodine.

Typical examples of N,N-dialkylanilines useful in the present invention include 4-cyano-N,N-dimethylaniline, 4-acetyl-N,N-dimethylaniline, 4-bromo-N,N-dimethylaniline, ethyl 4-(N,N-dimethylamino)benzoate, 3-chloro-N,N-dimethylaniline, 4-chloro-N,N-dimethylaniline, 3-ethoxy-N,N-dimethylaniline, 4-fluoro-N,N-dimethylaniline, 4-methyl-N,N-dimethylaniline, 4-ethoxy-N,N-dimethylaniline, N,N-dimethylaniline, N,N-dimethylthioanisidine, 4-amino-N,N-dimethylaniline, 3-hydroxy-N,N-dimethylaniline, N,N,N,N'-tetramethyl-1,4-dianiline, and 4-acetamido-N,N-dimethylaniline.

N,N-dialkylanilines are preferably substituted by an alkyl group in the ortho-position. Examples of such N,N-dialkylanilines include 2,6-diisopropyl-N,N-dimethylaniline, 2,6-diethyl-N,N-dimethylaniline, N,N-2,4,6-pentamethylaniline (PMA), and p-t-butyl-N,N-dimethylaniline.

These compounds have been known to not only serve as automatic oxidizing agents but also provide a higher efficiency in the initiation of polymerization.

The present color image recording material can also comprise a polymerization accelerator to improve the polymerization efficiency and hence reduce the exposure time or improve the degree of cure and hence S/N ratio. Such a polymerization accelerator is often significant.

For example, a radical polymerization chain transfer agent is useful. Examples of such a radical polymerization chain transfer agent include compounds as described in J. Brandrop and E. H. Immergut, "Polymer Handbook", 2nd ed., Wiley-Interscience Publication, II4, PP. 57–104. Typical examples of such compounds are mercapto compounds. In addition, a compound for improving the efficiency in the generation of radicals for the initiation of radical polymerization can be optionally used in the present invention.

On the contrary, a polymerization inhibitor can be used to improve the preservability of the image recording material until exposure. Examples of such a polymerization inhibitor include those described as inhibitors in J. Brandrop and E. H. Immergut, "Polymer Handbook", 2nd ed., Wiley-Interscience Publication, II-3, pp. 53–56.

Preferably, these materials related to polymerization are properly used depending on the properties of other materials used in combination therewith, such as polymerizable compounds, polymerization initiators and color image-forming substances, or the design of image recording materials.

An organic solvent is often used to facilitate the incorporation of the present color image-forming substance and photopolymerization initiator in the polymerizable compound before the emulsion-dispersion in a hydrophilic binder.

For example, the present color image-forming substance and photopolymerization initiator are dissolved in a low-boiling organic solvent such as lower alkyl acetate such as ethyl acetate and butyl acetate, ethyl secondary butyl alcohol, methyl isobutyl ketone, $\beta$-ethoxyethyl acetate, methyl cellosolve acetate, cyclohexanone, acetone, toluene, ethylene dichloride, dichloromethane, chloroform, N,N-dimethylformamide, tetrahydrofuran, dimethyl sulfoxide or the like, homogenized with a polymerizable compound, and then dispersed in a hydrophilic colloid.

Examples of high-boiling organic solvents which can be used in the present invention include alkyl phthalates such as dibutyl phthalate and dioctyl phthalate, phosphates such as diphenyl phosphate, triphenyl phosphate, tricyclohexyl phosphate, tricresyl phosphate and dioctylbutyl phosphate, citrates such as tributyl acetylcitrate, benzoates such as octyl benzoate, alkylamide such as diethyllaurylamide, fatty acid esters such as dibutoxyethyl succinate and dioctyl azerate, trimesates such as tributyl trimesate, carboxylic acids as described in JP-A-63-85633, and compounds as described in JP-A-59-83154, JP-A-59-178451, JP-A-59-178452, JP-A-59-178453, JP-A-59-178454, JP-A-59-178455, and JP-A-59-178457.

The above-mentioned high-boiling organic solvents and low-boiling organic solvents can be used in admixture. After dispersion, these low boiling organic solvents can be removed by ultrafiltration or the like.

Alternatively, a dispersion process using a polymer as described in JP-B-51-39853 and JP-A-51-59943 can be used. However, since the addition of an auxiliary solvent drastically affects the properties of oil drop, particularly polymerization rate, polymerization degree and degree of cure, this dispersion process must be carefully used. The grain diameter of dispersed oil drops can be freely controlled and selected depending on the purpose of application. For example, if a high resolving power is needed, the grain diameter of oil drops is minimized to such an extent that the resolving power is not married. The preparation of a dispersion such as mixed grain and packet emulsion can be accomplished by any known method.

When a polymerizable compound is dispersed in a hydrophilic colloid, various surface active agents can be used for the purpose of controlling dispersion as well as facilitating coating, inhibiting static electrification and adhesion, and improving sliding properties. For example, there can be used those described as surface active agents in JP-A-59-157636, pp. 37–38.

Furthermore, a high water absorptive polymer can be used in combination with a hydrophilic binder to accelerate the absorption of a processing solution during the treatment. This can lead to a better control of the viscosity of the coating solution or an improvement in the water absorption power which results in an improvement in the image quality.

Since the color light-sensitive material to be used in the present invention comprises a color image-forming substance which is colored, it is not so keenly desired to incorporate an anti-irradiation substance, anti-halation substance or various dyes in the light-sensitive element. However, in order to improve the sharpness of images, there can be incorporated a filter dye or absorbing substance as described in JP-B-48-3692, and U.S. Pat. Nos. 3,253,921, 2,527,583, and 2,956,879. As such a filter dye there can be preferably used a heat-decolorable dye. Preferred examples of such a heat-decolorable dye include those described in U.S. Pat. Nos. 3,769,019, 3,745,009, and 3,615,432.

Even if the color image-forming substance is colored yellow, magenta or cyan, when the color light-sensitive material comprises an infrared-sensitive layer, an antihalation treatment is needed. In this case, any known dye or pigment can be used to provide an antihalation layer. In order to provide an antihalation layer for the infrared-sensitive layer, an infrared absorbent or carbon black can be advantageously used. Carbon black is particularly useful for antihalation treatment. The support may be colored by carbon black. Alternatively, a carbon black-containing layer may be separately provided. Specific embodiments of such an antihalation treatment which can be used in the present invention include those described in JP-A-62-177542.

In the present method, the above-mentioned light-sensitive material is processed with an alkaline aqueous solution as described later. For the purpose of improving the efficiency of the processing or lowering the pH value of the processing solution, the light-sensitive material may comprise a base incorporated therein in the form of precursor.

The term "base precursor" as used herein means a compound which undergoes heating to release a base component or undergoes complexing reaction to produce a base. The base component thus released may be either inorganic or organic. There are known many such base components. Preferred examples of inorganic bases thus released include hydroxides of alkali metal or alkaline earth metal, secondary or tertiary phosphates, borates, carbonates, quinolinic acid salts, methaborates, ammonium hydroxides, quaternary alkyl ammonium hydroxides, and hydroxides of other metals. Preferred examples of organic bases thus released include aliphatic amines such as trialkylamines, hydroxylamines, and aliphatic polyamines, aromatic amines such as N-alkyl-substituted aromatic amines, N-hydroxylalkyl-substituted aromatic amines, and bis[p-(dialkylamino)-phenyl]methanes, heterocyclic amines, amidines, cyclic amidines, guanidines, and cyclic guanidines. Particularly preferred bases are those having a pKa value of 8 or more.

As a heating type base precursor there can be used a compound which undergoes a reaction on heating to release a base. Examples of such a compound include a salt of organic acid which undergoes decarboxylation and decomposition on heating with a base, and a compound which undergoes a reaction such as intramolecular nucleophilic displacement reaction, Lossen rearrangement, and Beckmann rearrangement to release amines. Preferred examples of such a base precursor include trichloroacetates as described in British Patent 998,949, α-sulfonylacetates as described in U.S. Pat. No. 4,060,420, propiolic acid salts as described in JP-A-59-180537, 2-carboxycarboxamide derivatives as described in U.S. Pat. No. 4,088,496, salts of organic bases and alkali metals or alkaline earth metals with heat-decomposable acids as described in JP-A-59-195237, hydroxam carbamates obtained by Lossen rearrangement as described in JP-A-59-168440, and aldoxime carbamates which produce nitrile on heating as described in JP-A-59-157637. Other useful examples of such a base precursor include those described in British Patents 998,945 and 2,079,480, U.S. Pat. No. 3,220,846, and JP-A-50-22625.

These base precursors can be used singly or in combination.

In the present invention, a difficultly water-soluble basic metal compound and a compound capable of complexing with metallic ions constituting the basic metal compound in the presence of water as medium (hereinafter referred to as "complexing compound") can be incorporated in the system, whereby the two compounds are allowed to undergo reaction in the presence of water to increase the pH value of the reaction system.

The above-mentioned base production method and specific examples of compounds and dispersion method to be used in the method are further described in U.S. Pat. No. 4,740,445.

In the present invention, a process is preferably used wherein a difficultly water-soluble basic metal compound is incorporated in the image-forming material, whereby water and a complexing substance are supplied thereinto from a processing solution. The film hardener required to harden the water-soluble binder is not specifically limited. As such a film hardener there can be used any known film hardener such as aldehyde (e.g., formaldehyde, glyoxal, glutaraldehyde), aziridine (e.g., those described in PB Report No. 19,921, U.S. Pat. Nos. 2,950,197, 2,964,404, 2,983,611, and 3,271,175, JP-B-46-40898, and JP-A-50-91315), isoxazole (e.g., those described in U.S. Pat. No. 3,331,609), epoxy (e.g.,

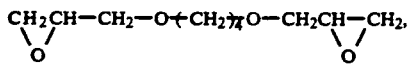

those described in U.S. Pat. No. 3,047,394, West German Patent 1,035,663, British Patent 1,033,518, and JP-B-48-35495), vinylsulfone (e.g., 1,3,5-triacryloyl-hexahydros-triazine, bis(vinylsulfonyl)methyl ether, N,N'-ethylene-bis(vinylsulfonylacetamido)ethane, N,N'-trimethyl-ene-bis(vinylsulfonylacetamide), those described in PB Report No. 19,920, West German Patents 1,100,942, 2,337,312, 2,545,722, 2,635,518, 2,742,308, and 2,749,260, British Patent 1,251,091, JP-B-45-54236, JP-B-48-110996, and U.S. Pat. Nos. 3,539,644 and 3,490,911), acryloyl (e.g., those described in U.S. Pat. No. 3,640,720), carbodiimide (e.g., those described in U.S. Pat. Nos. 2,938,892, 4,043,818 and 4,061,499, and JP-B-46-38715, triazine (e.g., 2,4-dichloro-6-hydroxy-s-triazine, those described in West German Patents 2,410,973 and 2,553,915, U.S. Pat. No. 3,325,287, and JP-A-52-12722), N-methylol (e.g., dimethylol urea, methyloldimethyl hydantoin), dioxane derivatives (e.g., 2,3-dihydroxydioxane), mucohalogenic acid (e.g., mucochloric acid, mucophenoxychloric acid), dialdehyde starch, 1-chloro-6-hydroxytriazinylated gelatin, maleimide, acetylene, and methanesulfonate.

Examples of high-molecular weight film hardeners include polymers containing aldehyde groups as described in U.S. Pat. No. 3,396,029 (e.g., copolymers of acrolein), polymers containing dichlorotriazine groups as described in U.S. Pat. No. 3,362,827, and Research Disclosure No. 17333 (1978), polymers containing epoxy groups as described in U.S. Pat. No. 3,623,878, polymers containing active vinyl groups or groups capable of becoming a precursor thereof as described in Research Disclosure No. 16725 (1978), U.S. Pat. No. 4,161,407, and JP-A-54-65033, and JP-A-56-142524, and polymers containing active ester groups as described in JP-A-56-66841.

The present color image-forming material may contain a discoloration inhibitor incorporated therein to improve the fastness of dye images formed thereon to light. As such a discoloration inhibitor there can be effectively used a photographic antioxidant, an ultraviolet absorbent or a metal complex. These discoloration inhibitors can be used singly or in combination (e.g., oxidation inhibitor and ultraviolet absorbent).

As the antioxidant which can be preferably used in the present invention, known antioxidants can be used.

The present color image-forming material can further optionally contain oil drops, polymer latexes, organic fluoro compounds, matting agents, lubricants, colloidal silica, anti-foaming agents, antibacterial agents, antifungal agents, antistatic agents, fluorescent brightening agents, water releasing agents, thermal polymerization inhibitors, and heat solvents, singly or in combination.

In the color image-forming material to be used in the present invention, the binder having a polymerizable compound dispersed therein is coated on a support such as flexible supports commonly used in photographic light-sensitive materials (e.g., plastic film, paper, cloth) and rigid supports (e.g., glass, ceramic, metal). Useful examples of such flexible supports include films made of semisynthetic or synthetic high-molecular weight compounds such as cellulose nitrate, cellulose acetate, cellulose acetate butyrate, polystyrene, polyvinyl chloride, polyethylene terephthalate, and polycarbonate, and films and resins related thereto. Other useful examples of such flexible supports include papers coated or laminated with baryta layer or α-olefin polymer (e.g., polyethylene, polypropylene, ethylene/butene copolymer). Polyesters as described in U.S. Pat. Nos. 3,634,089 and 3,725,070 can also be preferably used in the present invention. The present support can contain a dye or pigment or can be colored. For example, the support can be colored black for the purpose of screening light or like purposes. The surface of the support is preferably subjected to undercoating to facilitate adhesion. The surface of the support may be subjected to corona discharge, irradiation with ultraviolet light, flame treatment or the like before or after undercoating.

As metal having a hydrophilic surface to be used in the present invention there can be preferably used aluminum (including aluminum alloy), zinc, iron, copper or the like. Such a metal may be laminated or vacuum-deposited on a paper or plastic film to form a composite support or may form a support itself.

Preferred among these support materials are aluminum and a composite sheet comprising an aluminum sheet bonded to a polyethylene terephthalate film as described in JP-B-48-18327.

These supports can be optionally subjected to surface treatment or provided with a hydrophilic layer to obtain a hydrophilic surface. In order to render the support hydrophilic, various known methods can be employed.

The present support is not specifically limited and can be selected from groups other than that described above but depends on the purpose of application of the color images. For example, if the color light-sensitive material is used as a color filter, the support is required to exhibit a sufficient stability, uniformity, dimensional stability and light transmission. More particularly, if the color light-sensitive material is used as a color filter for liquid crystal display, the support is required to stay stable against heat (e.g., heated at 150° to 300° C. during the process for the preparation of oriented films), acids and organic solvents during the liquid crystal cell production process and still meet the requirements for prolonged use after the formation of liquid crystal cells, e.g., excellent strength and light transmission.

Accordingly, if the color light-sensitive material is used for liquid crystal display, the support is preferably a heat-resistant synthetic high-molecular weight film or glass.

If the support is a synthetic high-molecular weight film, the type of such a synthetic high-molecular weight film which can be used depends on the heating conditions in the production of cells. In general, synthetic high-molecular weight compounds described with reference to the support for the light-sensitive material can be used.

In some cases, a dye layer comprising a dye pattern formed together with its support may be glued to the front surface of the liquid crystal cell which has been produced. In this case, heating is not needed.

If the support is glass, any glass commonly used for the formation of liquid crystal cells can be used. In particular, glass having a low coefficient of thermal expansion and an excellent smoothness is preferably used. The glass support is preferably subjected to pretreatment to improve its adhesion to the coating dispersion. As the pretreatment there can be used any known method.

The support may be previously provided with a transparent electrode layer (patterning ITO, etc.). Alternatively, the support may be subjected to sputtering or ion plating after the formation of color filter to provide a transparent electrode thereon.

The support may be previously provided with black stripes. The formation of such black stripes can be accomplished by any known method such as vacuum deposition of chromium. With these black stripes, even if the transferred pixel images exhibit a low resolving power, a high resolving color filter can be obtained and black densities can be provided.

As described above, it is desired to select a proper support depending on the purpose of application of the color images thus formed.

The coating of the coating solution on a glass support can be accomplished by any suitable method such as roller coating, spin coating, dip coating and curtain coating. It is necessary to select a proper coating method which can provide a high smoothness on the coated surface and a uniform film.

The present invention will be further described with reference to the amounts of main materials to be incorporated in the present color image recording material, the dispersion and coating methods for the preparation of the present color image recording material, and the embodiments of the present color image recording material.

The proportion of the main components depend much on the purpose of application of the present color image recording material and thus can be selected from a wide range. Referring to polymerizable compounds, photopolymerization initiators, color image-forming substances and binders, the weight proportion of polymerizable compound to binder is in the range of about 0.1 to 10, preferably 0.3 to 3, and the amount of photopolymerization initiator to be incorporated depends much on the absorptivity coefficient of the molecule thereof, the radical production rate, the effects of oxygen and other compounds, or the like and is generally in the range of 0.05 to 10 mol % based on polymerizable compound. The amount of photopolymerization initiator to be incorporated can be properly selected depending on the desired light sensitivity or the like. The amount of photopolymerization initiator to be incorporated is normally in the range of 0.1 to 40 $g/m^2$, preferably 0.2 to 20 $g/m^2$.

The amount of color image-forming substance to be incorporated, too, depends much on the absorptivity coefficient and molecular weight thereof and is normally in the range of 0.1 to 50% by weight, preferably 1 to 20% by weight based on polymerizable compound and 0.05 to 10 $g/m^2$, particularly 0.1 to 5 $g/m^2$. In the present invention, the color image-forming substance is normally used in the form of a hydrophilic binder dispersion of finely divided grains contained in a polymerizable compound. In this form, the color image-forming substance is not necessarily dissolved in the polymerizable compound but may be solid-dispersed in the polymerizable compound.

However, in the case where the color image-forming substance is solid-dispersed in the polymerizable compound, it is desirable that a sufficient density be provided and the color image-forming substance be finely dispersed in the polymerizable compound for a higher efficiency in the elution during the processing. In particular, if the color image thus formed is used as a transparent image, it is necessary that the color image-forming substance be so finely dispersed in the polymerizable compound that the transparency of the color image is not married.

The solid dispersion system is often quite advantageous in that the stability of dyes after the formation of color images is improved and adverse effects on photopolymerization by exposure, e.g., inhibition of polymerization, are eliminated.

While the polymerizable compound is being dispersed in the water-soluble binder, the polymerizable compound is preferably completely contained in the polymerizable compound. However, even if the color image-forming substance is partially distributed in the water-soluble binder, it discolors during the processing, eliminating the problem of producing Dmin. If the amount of the color image-forming substance is increased depending on the amount thereof distributed in the binder, the desired Dmax can be secured. In this respect, too, it can be said that the present method has a high degree of freedom of design of the color image-forming substance.

The preparation of the dispersion composition can be normally accomplished by a process which comprises dissolving or dispersing a color image-forming substance, a photopolymerization initiator, and the like in a polymerizable compound directly or in the presence of an auxiliary solvent as described above, mixing the material with a polymerizable compound, and then mixing the mixture with a water-soluble binder solution in the presence of a dispersion aid such as surface active agent with stirring by means of a proper stirrer in accordance with the ordinary photographic emulsion method. The diameter of dispersed grains can be controlled by selecting the proportion of materials to be incorporated, the stirring conditions or the like and thus can be properly improved and applied to the purpose.

During the dispersion, the pH value of the image-forming element is normally adjusted to the range of 2 to 10, preferably 3 to 8.

The coating of the dispersion thus prepared can be accomplished by any suitable method such as roller coating, spin coating, dip coating and curtain coating. A proper coating method can be selected depending on the type of support and image-forming material used and the purpose of application.

The embodiment of the present color image recording material will be further described.

The present recording material can take a number of embodiments having different manners of arrangement of constituent elements. For example, the present recording material can be designed for simple monocolor single-layer system, full-color multi-layer system or full-color single-layer system.

The present invention will be further described with reference to the full-color system, by which the usefulness of the present invention can be accomplished. Referring to the method for the formation of full-color images, in order to obtain a wide range of colors in the chromaticity diagram by the subtractive color process (yellow, magenta and cyan), it is necessary that the light-sensitive material to be used in the present invention comprises at least three photopolymerization initiators (including sensitizers) having sensitivity in different spectral ranges.

Typical examples of a combination of at least three light-sensitive photopolymerization initiators having sensitivity in different spectral ranges include a combination of blue-sensitive, green-sensitive and red-sensitive photopolymerization initiators, a combination of green-sensitive, red-sensitive and infra-red-sensitive photopolymerization initiators, a combination of ultraviolet-sensitive, blue-sensitive and green-sensitive photopolymerization initiators, a combination of blue-sensitive, red-sensitive and infrared-sensitive photopolymerization initiators, a combination of ultraviolet-sensitive photopolymerization initiators (1), ultraviolet-sensitive photopolymerization initiators (2) and ultraviolet-sensitive photopolymerization initiators (3), and a combination of ultraviolet-sensitive photopolymerization initiators (1), ultra-violet-sensitive photopolymerization initiators (2) and red-sensitive photopolymerization initiator.

For example, if a combination of blue-sensitive photopolymerization initiator, green-sensitive photopolymerization initiator and red-sensitive photopolymerization initiator is used, the blue-sensitive portion, green-sensitive portion and red-sensitive portion of the system can contain a yellow image-forming substance, magenta image-forming substance and cyan image-forming substance, respectively.

In this case, it is desirable that the mixture of a blue-sensitive polymerization initiator, a polymerizable compound and a yellow image-forming substance, the mixture of a green-sensitive polymerization initiator, a polymerizable compound and a magenta image-forming substance and the mixture of a red-sensitive polymerization initiator, a polymerizable compound and a cyan image-forming substance be separated from each other. To this end, these mixtures can be coated on separate layers in a multi-layer construction or coated on the same layer in the form of packet or mixed grain.

The packeting process is further described in JP-A-58-40551.

It is also effective to separate these combination elements from each other in the form of microcapsule. This form provides a single-layer construction which drastically reduces the cost of coating. On the contrary, if these combination elements are separately coated on separate layers, they can be easily separated. To this end, various layer arrangement orders commonly used in color light-sensitive materials can be used. Alternatively, each layer may be divided into two or more layers having different sensitivities as necessary.

Two color image-forming substances can be used for one color-sensitive polymerization initiator.

For example, various combinations such as mixture of an ultraviolet-sensitive polymerization initiator, a polymerizable compound and yellow and magenta image-forming substances, mixture of a red-sensitive polymerization initiator, a polymerizable compound and yellow and cyan image-forming substances, and mixture of a green-sensitive polymerization initiator, a polymerizable compound and magenta and cyan image-forming substances are possible. Furthermore, three color (blue, green, and red) image-forming substances can be used.

Besides the above-mentioned three colors, black can be used.

Besides the above-mentioned light-sensitive layers, the color image recording material to be used in the present invention can optionally comprise auxiliary layers such as smooth layer, oxygen barrier layer, subbing layer, protective layer, interlayer, anti-halation layer, antistatic layer, anticurl layer (mainly provided on backing layer), release layer and matting agent layer.

For example, in order to provide an antistatic layer, the light-sensitive material can comprise a cationic polymer or anionic polymer on its backing layer for the purpose of inhibiting static electrification. To this end, a cationic polymer can be used, particularly a polymer containing a quaternary amine salt. The polymer can be used in the form of aqueous solution or latex.

The above-mentioned polymer can be incorporated in all or one or more of the layers constituting the backing layer. Alternatively, the above-mentioned polymer can be incorporated in the uppermost layer.

Other examples of antistatic agents which can be preferably used in the present invention include compounds as described in British Patent 1,466,600, *Research Disclosure* Nos. 15840, 16258, and 16630, and U.S. Pat. Nos. 2,327,828, 2,861,056, 3,206,312, 3,245,833, 3,428,451, 3,775,126, 3,963,498, 4,025,342, 4,025,463, 4,025,691, and 4,025,704.

The present invention will be further described hereinafter with reference to the method of recording images on the above-mentioned color image recording material.

The exposure of the light-sensitive material to light will be first explained.

In the present invention, various means of exposure can be used.

In general, as a light source there can be used a light source commonly used, such as sunlight, strobe, flash lamp, tungsten lamp, mercury vapor lamp, halogen lamp (e.g., iodine lamp), xenon lamp, laser, CRT, plasma, fluorescent lighting, and light-emitting diode. Furthermore, a means of exposure made of a combination of a micro shutter utilizing LCD (liquid crystal display) or PLZT (lanthanum-doped lead titanium zirconate) and a linear or planar light source can be used. The type of light source and the exposure can be selected depending on the sensitive wavelength provided by dye sensitization of silver halide or the sensitivity.

The original to be used in the present invention may be either a black-and-white image or color image.

The original may be a photographic image having a gradation, such as a negative color original, not to mention, a line original such as drawing. Cameras can be used to photograph personage or scenary on the color image recording material. The original can be printed on the color image recording material in contact printing process, reflection printing process or enlarging printing process.

Furthermore, images photographed by video camera or image data televised by television stations can be directly displayed on CRT or FOT, and the images thus displayed can be printed on the color image recording material in contact process or through a lens for focusing the images on the color image recording material.

LED's (light-emitting diode), which have recently made a rapid progress, have begun to find use as means of exposure or display in various apparatus. However, it is difficult to produce an LED capable of effectively emitting blue light. In order to overcome this difficulty, the reproduction of color images can be effected by means of three LED's which emit green light, red light and infrared light, respectively. The photopolymerization initiators sensitive to these lights can be designed to contain yellow, magenta and cyan image-forming substances, respectively.

Specifically, the green-sensitive portion, red-sensitive portion and infrared-sensitive portion of the light-sensitive material can be designed to contain yellow, magenta and cyan image-forming substances, respectively. Other different combinations can be used as necessary.

Besides the above-mentioned methods in which the original is printed in contact process or projected on the light-sensitive material, the original irradiated with light is read out by a light-receiving element such as phototube and CCD. The data thus read are then stored in a memory such as computer. The data are subjected to so-called image processing as necessary. The image data thus processed are then reproduced on CRT. The image data thus reproduced are used as light source to which the light-sensitive material is exposed. Alternatively, the image data thus processed may be directly used to allow three types of LED's to emit light to which the light-sensitive material is exposed.

The color light-sensitive material to be used in the present invention, particularly in the case of a full-color light-sensitive material, comprises oil drops of polymerizable compounds containing photopolymerization initiators having sensitivity in plural spectral ranges and thus needs to be imagewise exposed to the corresponding plural spectral lines. Accordingly, the above-mentioned light sources can be used singly or in combination.

Referring to, for example, the preparation of a color filter according to the present color image formation method, the light source can be selected depending on the desired sensitive wavelength of the color light-sensitive material as well as on whether the image data are processed in the form of electrical signal or not, the processing speed of the entire processing system, compactness, electric power consumption, etc.

If the image data are not processed in the form of electrical signal, that is, the color light-sensitive material is exposed to light through a photomask (color mosaic mask) required to form the desired color mosaic, cameras, exposure apparatus for printing process such as printer and enlarger, exposure apparatus for copying machine, etc. can be used. In this case, the color light-sensitive material can be exposed to a two-dimensional image at a shot or in a scanning manner through a slit or the like. The image to be printed can be enlarged or reduced from the photomask. It goes without saying that the exposure is normally effected in contact process to obtain the same scale as the photomask. In this case, the degree of contact greatly affects the resolving power of color images thus produced. For example, vacuum can be used to provide an effective contact. In this case, a light source such as tungsten lamp is normally used rather than monochromatic light source such as laser.

If the image data is recorded after being processed in the form of electrical signal, as exposure apparatus there can be used light-emitting diodes and various lasers in combination according to the color sensitivity of the color light-sensitive material or various devices known as image display devices (e.g., CRT, liquid crystal display, electroluminescence display, electrochromic display, plasma display). In this case, as mosaic image data there can be used image signals produced by video camera or electronic still camera, television signals represented by Nippon Television Signal Code (NTSC), image signals obtained by dividing photomask into many picture elements by scanner or the like, and image signals stored in a recording material such as magnetic tape and disc.

For the exposure to a color mosaic pattern, LED's lasers, fluorescent tubes and the like can be used in combination according to the color sensitivity of the light-sensitive material. In this case, the same or different types of light sources can be used in combination. In respect to the color sensitivity of the light-sensitive material, sensitivities to red, green and blue are usual in the field of photography. However, it is a recent tendency that these color sensitivities are used in combination with sensitivities to ultraviolet and infrared. Thus, the range of light sources used has been expanded. For example, the color ranges to which the color light-sensitive material to be used for micro color filter is sensitive may be various spectral ranges such as green, red and infrared, red, infrared (short wavelength) and infrared (long wavelength), and ultraviolet (short wavelength), ultraviolet (middle wavelength) and ultraviolet (long wavelength). Spectral ranges are selected depending on the purpose of application. This system has some advantages. For example, short wavelength ranges are favorable to resolving power. As light source there can be used a combination of different kinds of light sources, e.g., combination of two LED's which emit different colors and a laser. A single light-emitting tube or element may scan every single color. Alternatively, in order to improve the exposure speed, an array of light-emitting tubes or elements can be used. Examples of such an array which can be used include LED array, liquid crystal shutter array, and magnetic optical element shutter array.

Examples of the above-mentioned image display devices include display devices which enable color display and monochromatic display, e.g., CRT. A system can be used in which a monochromatic display is combined with a filter so that several exposures can be effected. The existing two-dimensional image display device can be used to provide one-dimensional data as in FOT. Alternatively, one picture on such an image display device can be divided into several sections which are scanned.

When the light-sensitive material is absorbed under a reduced pressure during the exposure to a pattern image, the light-sensitive material preferably comprises a smooth backing layer as described in JP-A-62-90653. If a photomask is used for the exposure, the photomask must be designed to meet the requirements for the light source and light-sensitive material used in combination, i.e., spectral absorptivity, size, precision (edge sharpness) and uniformity.

It goes without saying that the properties of the photomask greatly affects the properties of the finished color filter. The exposure allows a photopolymerization initiator to initiate the curing of a polymerizable compound. The polymerization can be accelerated by heating the color image recording material. Furthermore, the effects of oxygen can be eliminated by effecting the polymerization in an oxygen-free atmosphere (e.g., vacuum, nitrogen atmosphere, argon stream). These measures have a great effect on the polymerization rate, degree of cure, gradation, S/N ratio, etc. and thus are often very effective. Moreover, the exposure can be effectively performed with a transparent sheet capable of blocking oxygen (having no adverse effects on exposure) laminated on the photomask.

Since the resolving power is affected by the scattering of light, measures are provided to inhibit irradiation or halation as necessary.

For example, it is effective for the inhibition of halation to provide an antihalation layer (e.g., carbon black), color the support, or put the light-sensitive material on a light-absorbing material (e.g., black paper) during exposure.

The system can be effectively designed so that the color image-forming substance serves as an anti-irradiation dye.

The processing solution to be used in the embodiment (a) of the present invention is an alkaline aqueous solution. The composition of the alkaline aqueous solution is properly selected depending on the color image recording material to be processed thereby.

The alkalinity of the processing solution is enough to adjust the pH value thereof to 9 to 14. Examples of inorganic bases which can be incorporated in the alkaline aqueous solution include hydroxides of alkali metals or alkaline earth metal (e.g., sodium hydroxide, potassium hydroxide, lithium hydroxide), secondary or tertiary phosphates (e.g., potassium phosphate), borates, carbonates, quinolinates, metaborates, ammonium hydroxide, hydroxides of quaternary alkylammonium (e.g., tetramethylammonium hydroxide), and other metal hydroxides. Examples of organic bases which can be incorporated in the alkaline aqueous solution include aliphatic amines such as trialkylamines, hydroxylamines, and aliphatic polyamines, aromatic amines such as N-alkyl-substituted aromatic amines, N-hydroxylalkyl-substited aromatic amines, and bis[p-(dialkylamino)-phenyl]methanes, heterocyclic amines, amidines, cyclic amidines, guanidines, and cyclic guanidines.

Furthermore, salts of the above-mentioned organic bases with weak acids, such as carbonates, bicarbonates, borates, secondary and tertiary phosphates, quinolinates, acetates, and metaborates can be used. Besides these salts, compounds as described in JP-A-59-218443 can be used. The bases to be used are properly selected depending on the purpose of application. For example, in the case of color filters, the presence of alkali metals causes troubles. Therefore, other bases are preferably used. However, in this case, such troubles can also be eliminated by thoroughly washing the light-sensitive material with water after being processed with a base containing an alkali metal.

The alkaline processing solution may also contain a complexing compound of complex-forming type base precursor as described above.

Specific examples of such a complexing compound include salts of aminocarboxylic acids, iminodiacetic acids and derivatives thereof, anilinecarboxylic acids, pyridinecarboxylic acids, aminophosphoric acids, carboxylic acids (e.g., monocarboxylic acid, dicarboxylic acid, tricarboxylic acid, tetracarboxylic acid, compounds containing substituents such as phosphono, hydroxyl, oxo, ester, amide, alkoxy, mercapto, alkylthio, and phosphino groups), hydroxamic acids, polyacrylates, and polyphosphoric acids with alkali metals, guanidines, amidines and quaternary ammonium.

The above-described bases or base precursors can be simply dissolved in water to prepare a processing solution. In addition to water, aids, solvents or additives can be added to the processing solution for the purpose of accelerating penetration through the image recording material or elution of a color image-forming substance from the polymerizable compound or improving the stability of the processing solution itself.

As described above, the processing solution to be used in the embodiment (b) of the discoloration process of the present invention is a solution containing a compound capable of chemically changing chromophores. Such a processing solution can be properly prepared according to the color image recording material to be processed thereby. In particular, a processing solution containing sodium hydrosulfite can be preferably used.

The above-mentioned processing solutions often comprise water as solvent. The term "water" as used herein means not only so-called "pure water" but also water commonly used.

Furthermore, the processing solution to be used in the embodiment (a) or (b) may comprise aids, solvents or additives for the purpose of accelerating penetration through the image recording material, accelerating elution or discoloration reaction, removing the product of the discoloration reaction from the image recording material, improving the stability of the images thus processed, improving the stability of the processing solution itself or like purposes.

For example, a thickening agent can be used to uniformly spread the processing solution. Examples of such a thickening agent which can be used in the present invention include polyvinyl alcohol, hydroxyethyl cellulose, and alkali metal salts of carboxymethyl cellulose. Particularly preferred among these compounds are hydroxyethyl cellulose, and sodium carboxymethyl cellulose.

As wetness improver there can be used effectively various surface active agents.

Examples of such surface active agents include nonionic surface active agents such as saponin (steroid series), alkylene oxide derivatives (e.g., polyethylene glycol, polyethylene glycol/polypropylene glycol condensate, polyethylene glycol alkyl ethers, polyethylene glycol alkylaryl ethers, polyethylene glycol esters, polyethylene glycol sorbitan esters, polyalkylene glycol alkylamines, polyalkylene glycol alkylamides, polyethylene oxide addition products of silicone), glycidol derivatives (e.g., polyglyceride alkenylsuccinate, alkylphenol polyglyceride), and alkyl esters such as aliphatic esters of polyhydric alcohols; anionic surface active agents containing acidic groups such as carboxy group, sulfo group, phospho group, sulfuric ester group and phosphoric ester group (e.g., alkylcarbonate, alkylsulfonate, alkylbenzenesulfonate, alkylnaphthalenesulfonate, alkylsulfuric acid ester, alkylphosphorc esters, N-acyl-N-alkyltauric acid, sulfosuccinic esters, sulfoalkyl polyoxyethylene alkylphenyl ethers, and polyoxyethylene alkyleicosanic esters); amphoteric surface active agents such as amino acids, aminoalkylsulfonic acids, aminoalkylsulfuric esters, aminoalkylphosphoric esters, alkylbetaines, and amine oxides; and cationic surface active agents such as alkylamine salts, aliphatic or aromatic quaternary ammonium salts, heterocyclic quaternary ammonium salts (e.g., pyridinium, imidazolium), and phosphonium or sulfonium salts containing aliphatic or heterocyclic groups. Other useful examples of surface active agents include organic compound-containing surface active agents and those described in JP-A-62-173463, JP-A-62-91947, and U.S. Pat. No. 4,784,931.

In order to inhibit foaming, the processing solution can comprise an anti-foaming agent.

As such an anti-foaming agent there can be used known compounds. Among these anti-foaming agents, silicone oil is preferably used as chemically stable and effective anti-foaming agent. In order to inhibit rotting, the processing solution can comprise an antibacterial or antifungal agent.

As such antibacterial or antifungal agent there can be used any water-soluble antibacterial or antifungal agent. Specific examples of such a water-soluble antibacterial or antifungal agent include thiazolylbenzimidazole compounds, isothiazolone compounds, chlorophenol compounds, bromophenol compounds, thiocyanic acid compounds, isocyanic acid compounds, acid azide compounds, diazine compounds, triazine compounds, thiourea compounds, alkylguanidine compounds, quaternary ammonium salts, organic tin compounds, organic zinc compounds, cyclohexylphenol compounds, imidazole compounds, benzimidazole compounds, sulfamide compounds, active halogen compounds such as sodium chloroisocyanarate, chelating agents, sulfinic acid compounds, and antibiotics such as penicillin. Other useful examples of antibacterial or antifungal agents include germicides as described in L. B. West, "Water Quality Criteria", Phot. Sci. and Eng., vol. 9, No. 6, 1965, various antifungal agents as described in JP-A-57-8542, JP-A-58-105145, JP-A-59-126533, JP-A-55-111942, and JP-A-57-157244, and antibacterial and antifungal agents as described in Hiroshi Horiguchi, *Bokin Bobai no Kagaku*, Sankyo Shuppan, 1982.

As described above, these anti-foaming agents or antibacterial or antifungal agents can be effectively incorporated in the image recording material. The solvent is not limited to water. As such a solvent there can be used a mixture of commonly used water-soluble organic solvents such as alcohol (e.g., methanol, ethanol, isopropyl alcohol, benzyl alcohol, ethylene glycol, polyethylene glycol, methyl cellosolve), ketone (e.g., acetone, methyl ethyl ketone, acetyl acetone), ester (e.g., methyl acetate, ethyl acetate, butyl phosphate), amide (e.g., N,N-dimethylformamide, N,N-dimethylacetamide), urea (e.g., tetramethylurea), ether (e.g., tetrahydrofuran, 1,4-dioxane), sulfoxide (e.g., dimethyl sulfoxide, sulfolane), and nitrogen-containing acetonitrile (e.g., pyridine, picoline, methylamine).

The processing solution also can effectively comprise a phase transfer catalyst which serves to facilitate the penetration thereof through the polymerizable compound (e.g., tetramethylammonium bromide).

The processing solution to be used in the embodiment (a) of the present invention can comprise a compound commonly used for the preparation of a buffer solution to allow the alkaline processing solution to keep its buffer capacity of resisting changes in pH. For example, carboxylic acid, boric acid, carbonic acid, phosphoric acid or the like can be used. It is thought that these acids are present in the processing solution in the form of salts as described above.

If the elution of the color image-forming substance is accompanied by hydrolysis which causes production of dissociative groups, the processing solution can comprise an accelerator or nucleophillic agent which accelerates hydrolysis reaction. Examples of such a nucleophilic agent include $O^\ominus R$ (in which R represents an alkyl or aryl group), hydroxamic acid, anions such as $SO_3^{2\ominus}$, primary amines, secondary amines, hydrazines, hydroxylamines, thiols, organic selenium compounds, lithium ion, cyan ion, silyl compounds, and fluorine ion.

If the color image-forming compound undergoes some reaction other than hydrolysis to produce dissociative groups from the precursor structure of the dissociative groups and become soluble in an alkaline aqueous solution, it goes without saying that the processing solution needs to comprise a reagent which contributes to the reaction. In this case, these additives greatly vary with the type of reaction and reactive substrate and thus cannot be unequivocally described. For example, if the color image-forming compound undergoes reduction reaction to initiate deprotection reaction which causes production of dissociative groups, the addition of a reducing agent is needed. Such a reducing agent may be either an inorganic compound or an organic compound. The reduction can be effected by the addition of hydrogen in the presence of a catalyst or the supply of electric current. The two methods can be used in combination. Alternatively, a precursor which does not have any reducing power itself but exhibits a reducing power by the action of heat can be used.

Examples of such a reducing agent include reducing agents and reducing agent precursors as described in U.S. Pat. No. 4,500,626 (49th to 50th columns), U.S. Pat. No. 4,483,914 (30th to 31st columns), U.S. Pat. No. 4,330,617, and 4,590,152, JP-A-60-140335 (pp.17-18), JP-A-57-40245, JP-A-56-138736, JP-A-128438, JP-A-60-128436, JP-A-60-128439, JP-A-60-128437, JP-A-62-

131253, and JP-A-62-131256, and European Patent 220,746A2 (pages 78 to 96).

A combination of various reducing agents as disclosed in U.S. Pat. No. 3,039,869 can be used.

The processing solution to be used in the embodiment (b) of the present invention can effectively comprise a base or a salt of strong base with an weak acid to effect the discoloration reaction at a proper pH range or inhibit the release of ions if sodium hydrosulfite is used. Examples include sodium hydroxide, potassium hydroxide, potassium carbonate, guanidine carbonate, aliphatic amines (e.g., triethylamine), sodium metaborate, and tertiary sodium phosphate.

If an azochelate dye is used, a chelating agent such as EDTA and picolic acid can be incorporated in the processing solution.

On the other hand, in order to remove anions produced by the discoloration reaction to improve the preservability of the images thus formed, the light-sensitive material can be subjected to extraction in an acidic bath.

In order to improve the preservability of color images formed in either the embodiment (a) or (b), a discoloration inhibitor, ultraviolet absorbent, anti-oxidant or the like can be incorporated in the processing solution. Alternatively, a compound for improving the film quality can be incorporated in the processing solution.

The series of processings can be followed by another rinse to remove undesirable components from the system.

Alternatively, the image recording material which has been thus processed can be washed with an organic solvent to remove unnecessary lipophilic components therefrom.

These additives can be incorporated in the processing solution. Alternatively, a solution of these additives can be used before or after the processing.

When the color image-forming substance is subjected to elution with the above-mentioned processing solution from the uncured portions of the polymerizable compound or discoloration with the processing solution, the image recording material on which polymerized images have been formed is normally dipped in the processing solution, allowed to stand, and then stirred or subjected to ultrasonic treatment so that the color image-forming substance is extracted into the aqueous phase of the processing solution. During this process, the temperature of the processing solution is normally in the range of the freezing point of the processing solution or higher to the boiling point of the processing solution or lower, particularly 5 to 40° C. However, this process can be effected at an elevated temperature as higher than 40° C. to improve the efficiency of elution or discoloration. The color light-sensitive material is normally dipped in the processing solution. However, the application of the processing solution to the color light-sensitive material can be accomplished by any suitable process such as roller coating process or wire bar coating process as described in JP-A-59-181353, process which comprises the use of water absorbing member to coat the processing solution on the photographic material as described in JP-A-59-181354, process which comprises forming beads between a water-repellent roller and an image-forming material to apply the processing solution to the image-forming material as described in JP-A-59-181348, extrusion process, process which comprises jetting the processing solution through nozzles, and process which comprises depressing pods containing the processing solution.

These processing solutions can be used singly or in combination. The process for elution or discoloration of the color image-forming substance can be effected once or plural times. Prior to the elution or discoloration of the color image-forming substance with the processing solution, a pretreatment process (e.g., swelling process for facilitating washing with an alkaline aqueous solution or discoloration, protection treatment for inhibiting damage by an alkali) can be effected.

In the embodiment (a) of the present invention, the color image-forming substance can be subjected to pretreatment in an alkali where it is deprotected to take the form of conjugate acid of dissociative acid which then undergoes dissociation with an alkaline processing solution to make water-soluble groups which can be easily washed off. Another treatment as described above can be interposed between plural alkaline wash-off processes.

These treatments are not specifically limited and can be properly selected depending on the purpose of application.

After the above-mentioned processings, washing is normally effected to remove undesirable components (e.g., base, additives).

As washing solvent to be used in the washing process there can be used "ordinary water", of course. For the purpose of improving the washing effect or the properties of color images, additives or other water-soluble organic solvents can be added to the washing solution.

As such additives there can be used those described with reference to the processing solution. On the contrary, for the purpose of decreasing the ion content of the color image recording material, "pure water" can be often used. The pH value of the washing water can be effectively controlled to alter the film pH. Furthermore, an organic solvent can be used as washing solvent to remove unnecessary lipophilic components from the color image recording material. Organic solvents can be used singly or in admixture. These organic solvents can contain water. The temperature condition and other process conditions of the washing step are similar to the above-mentioned elution process. In addition, various post-treatments are properly selected depending on the purpose of application of color images thus formed.

For example, the improvement in the film quality is effective. In particular, if gelatin is used as binder, commonly known various methods of improving the film quality can be employed. A suitable film hardener can be effectively used to further cure the film and provide a strong film, thereby improving the resistance of dyes and layers. As such film hardeners there can be used those described above. Alternatively, gelatin bichromate curing method can be used.

For the purpose of improving the resistance of color images or the stability of the image recording material, a process can be effected to incorporate various additives such as stabilizer, ultraviolet absorbent, discoloration inhibitor, antioxidant and antibacterial or antifungal agent in the image recording material. Furthermore, a process can be effectively effected to cure the uncured polymerizable compound to improve its stability in the recording material. In this curing (polymerization) process, if a photopolymerization initiator is significantly left in the system, only the front surface of the light-sensitive material can be exposed to light. However, a photopolymerization initiator can be introduced from outside the system. Besides the photopolymerization, heat polymerization can be effectively effected by heating the front surface of the light-sensitive material. Heating can be used not only for post-treatment but also for exposure. During the exposure, heating can be used to accelerate polymerization. After the exposure, heating can also be used to accelerate polymerization for pre-treatment.

Furthermore, a protective layer can be further provided on the color image recording layer or a protective layer provided thereon to improve the smoothness and resistance and obtain many other effects. For example, in the case of color filter, this measure is particularly advantageous in that it can prevent the discharge of eluates from the color image recording layer and provide a rather smooth color filter.

It goes without saying that this measure is also effective for the purpose of protecting color filter. For example, if the color image recording material is subjected to the process for the preparation of liquid crystal cell, it must be subject to severe conditions such as heat, solvent and acid and thus needs to protect the color image recording layer.

The protection of the light-sensitive material can be accomplished by any method commonly used in the production of color filter, such as dyeing process and pigment-containing resist process.

The present light-sensitive recording material and the method for the formation of color images thereon will be further described in the following examples, but the present invention should not be construed as being limited thereto.

EXAMPLE 1

A uniform solution of 150 mg of a color image-forming substance D-1, 5 ml of dichloromethane, 2.5 g of a polymerizable compound R-1, 80 mg of a photopolymerization initiator P-1, and 80 mg of a photopolymerization initiator P-2 was added to 26 g of a 10% aqueous solution of gelatin which had been kept at a temperature of 45° C. with stirring. 1 ml of a 2% aqueous solution of a surface active agent K-1 was then added to the solution. The mixture was then subjected to emulsion dispersion in a homogenizer at 15,000 rpm and a temperature of 40° C. over 5 minutes. 5.5 g of a 2% aqueous solution of a film hardener H-1 was added to the solution. The mixture was then stirred at a temperature of 40° C. over 1 minute to prepare a dispersion.

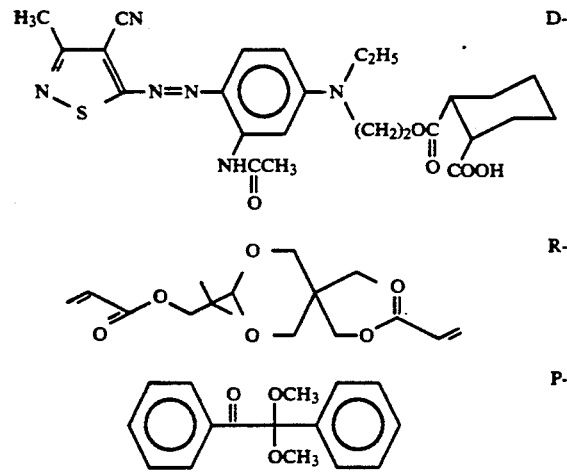

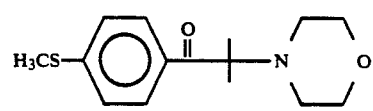

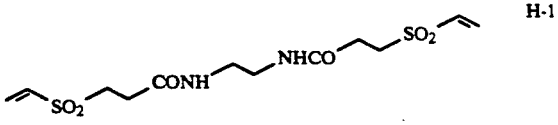

The dispersion thus prepared was then observed under a microscope. As a result, it was found that the oil drop size was 1 μm or less and the dye (D-1) was completely contained in these oil drops.

The dispersion was then coated on a polyethylene terephthalate film (comprising gelatin subbing layer) to a wet film thickness of 60 μm. The material was dried at a temperature of 50° C. over 40 minutes and then at a temperature of 20° C. over 24 hours to cure the film. Thus, Specimen S-1 was prepared. A chromium-deposited resolving mask was allowed to come in contact with Specimen S-1 in vacuo. The specimen was then exposed to light from high-pressure mercury vapor lamp (ozoneless; 120 w/cm) over 1,000 counts (about 4 minutes). The specimen was then dipped in a 0.1N aqueous solution of sodium hydroxide (containing 3% methanol and 0.1% $C_{12}H_{25}.C_6H_4.SO_3Na$), washed by means of an ultrasonic cleaner over 5 minutes, washed with water, and then dried. The specimen was entirely exposed to light in the same conditions as described above so that the uncured portions were cured. The finished specimen exhibited an excellent S/N ratio at both the exposed and unexposed portions as set forth in Table 1.

TABLE 1

|  | Exposed portion | Unexposed portion |
|---|---|---|
| Density before washing | 2.10 | 2.10 |
| Density after washing | 1.70 | 0.02 |

The specimen exhibited a resolving power of 1 to 2 μm. Thus, it was found that the specimen can find its good use in the formation of ordinary photographic images as well as color filters requiring a high resolving power.

Specimens S-2, S-3, S-4 and S-5 were prepared in the same manner as in Specimen S-1 except that the polymerizable compound R-1 was replaced by polymerizable compounds R-2, R-3, R-4 and R-5, respectively, and then exposed to light in the same manner as in Specimen S-1.

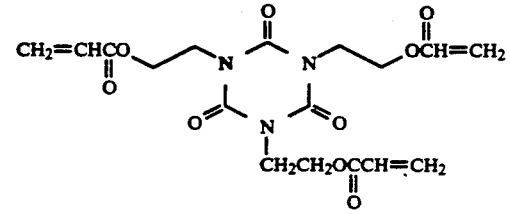

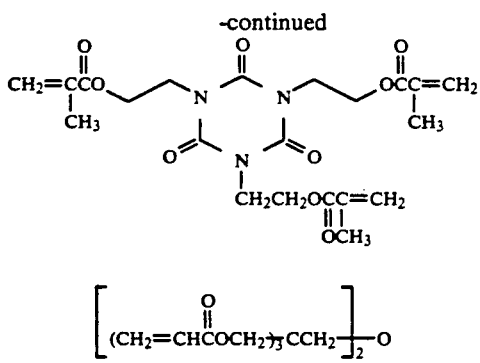

R-4

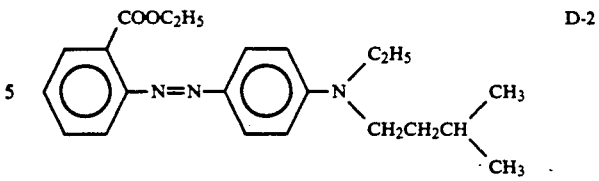

R-5

As set forth in Table 2, the specimens comprising other polymerizable compounds exhibited an excellent discrimination at both the exposed and unexposed portions.

TABLE 2

| Specimen | Exposed portion | Unexposed portion |
|---|---|---|
| S-2 | 1.53 | 0.01 |
| S-3 | 1.95 | 0.02 |
| S-4 | 1.92 | 0.02 |
| S-5 | 1.65 | 0.02 |

Specimens S-6 to S-16 were prepared in the same manner as in Specimen S-1 except that the color image-forming substance D-1 replaced by the above mentioned exemplary compounds (a)-1, (a)-2, (a)-6, (a)-11, (a)-26, (a)-37, (a)-45, (a)-51, (a)-73, (a)-89, and a compound D-2 which is obtained by replacing the dissociative carboxyl group by an ester group, respectively, and then subjected to exposure and processing in the same manner as in Specimen S-1.

As set forth in Table 3, the specimens comprising these different color image-forming substances exhibited an excellent discrimination at both the exposed and unexposed portions.

It is also shown that Specimen S-16 comprising D-2, which doesn't produce any dissociative group upon processing with an alkaline aqueous solution, exhibited little or no dye elution even at the unexposed portions, providing no S/N images.

TABLE 3

| Specimen | Exposed portion | Unexposed portion |
|---|---|---|
| S-6 | 1.35 | 0.01 |
| S-7 | 1.51 | 0.03 |
| S-8 | 1.62 | 0.01 |
| S-9 | 1.58 | 0.02 |
| S-10 | 1.72 | 0.02 |
| S-11 | 1.85 | 0.02 |
| S-12 | 1.80 | 0.04 |
| S-13 | 1.77 | 0.03 |
| S-14 | 1.74 | 0.02 |
| S-15 | 0.93 | 0.01 |
| S-16 | 1.44 | 1.43 |

EXAMPLE 2

A specimen was prepared in the same manner as in Example 1 except that a dye D-3 was used and 50 mg of an aniline compound A-1 was added to the system.

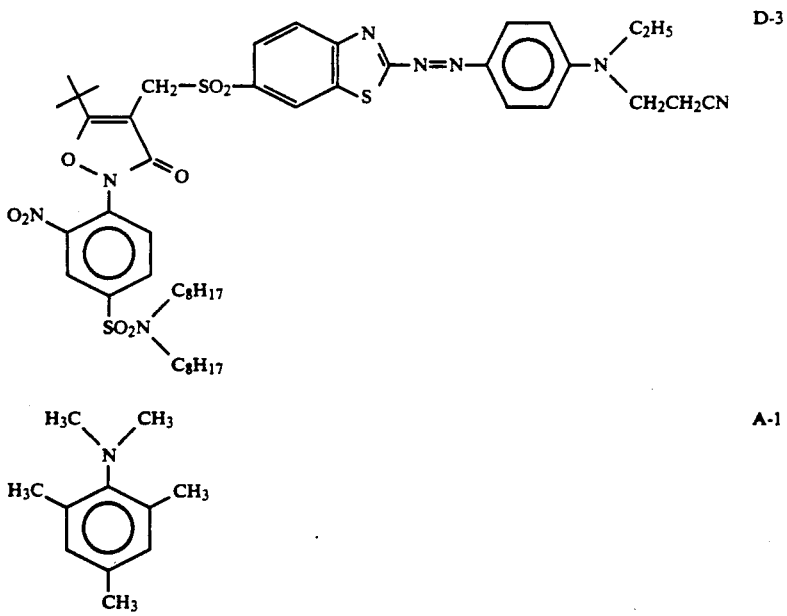

The specimen thus prepared was then exposed to light through a step wedge over 2,000 counts in the same manner as in Example 1. The specimen was then dipped in Processing Solution A and subjected to ultrasonic treatment over 3 minutes. The specimen was further dipped in Processing Solution B and subjected to ultrasonic treatment over 3 minutes. The specimen was washed with water, and then dried.

| Processing Solution A | |
|---|---|
| 2,5-Dimethylhydroquinone | 5 g |
| 4-Hydroxymethyl-4-methyl-1-phenyl-3-pyrazolidinone | 5 g |
| pH 11.8 Britton-Robinson buffer solution | 100 ml |
| Processing Solution B | |
| Potassium carbonate | 5 g |
| Water | 100 ml |
| Ethanol | 5 ml |

As set forth in Table 4, the finished specimen provided a positive image with an excellent discrimination. A comparative specimen which had been finished through the processing with Processing Solution B only provided an image with little or no S/N ratio.

This shows that the reduction reaction at the processing with Processing Solution A initiates deprotection to produce dissociative groups.

TABLE 4

|  | $D_{max}$ | $D_{min}$ | Number of Steps |
|---|---|---|---|
| Processings with Processing Solutions A + B | 1.20 | 0.21 | 5 |
| Processing with Processing Solution B | 1.31 | 1.51 | 1 |

EXAMPLE 3

Preparation of Dispersion I

A uniform solution of 200 mg of a dye D-4, 5 ml of ethyl acetate, 3 g of a polymerizable compound R-6, 20 mg of a photopolymerization initiator P-1, 20 mg of P-2, 30 mg of 3-thenoyl-7-diethylaminocoumarin, 50 mg of pentamethylaniline, and 20 mg of 2,6-diisopropylaniline was added to 25 g of a 10% aqueous solution of gelatin with stirring at a temperature of 45° C. 4 ml of a 1% aqueous solution of a surface active agent K-1 was added to the material. The mixture was then subjected to dispersion in a homogenizer at 13,000 rpm and a temperature of 40° C. over 5 minutes. 5 g of a 2% aqueous solution of a 3:1 mixture of film hardeners H-1 and H-2 was added to the dispersion. The material was then stirred over 1 minute to prepare Dispersion I.

Preparation of Dispersion II

Dispersion II was prepared from a uniform solution of 200 mg of a dye D-5, 6 ml of ethyl acetate, 3 g of the polymerizable compound R-6, 30 mg of a photopolymerization initiator P-3, 10 mg of a sensitizer S-1, 10 mg of a sensitizer S-2, and 20 mg of pentamethylaniline in the same manner as in Dispersion I.

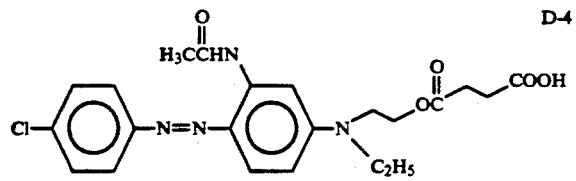

D-4

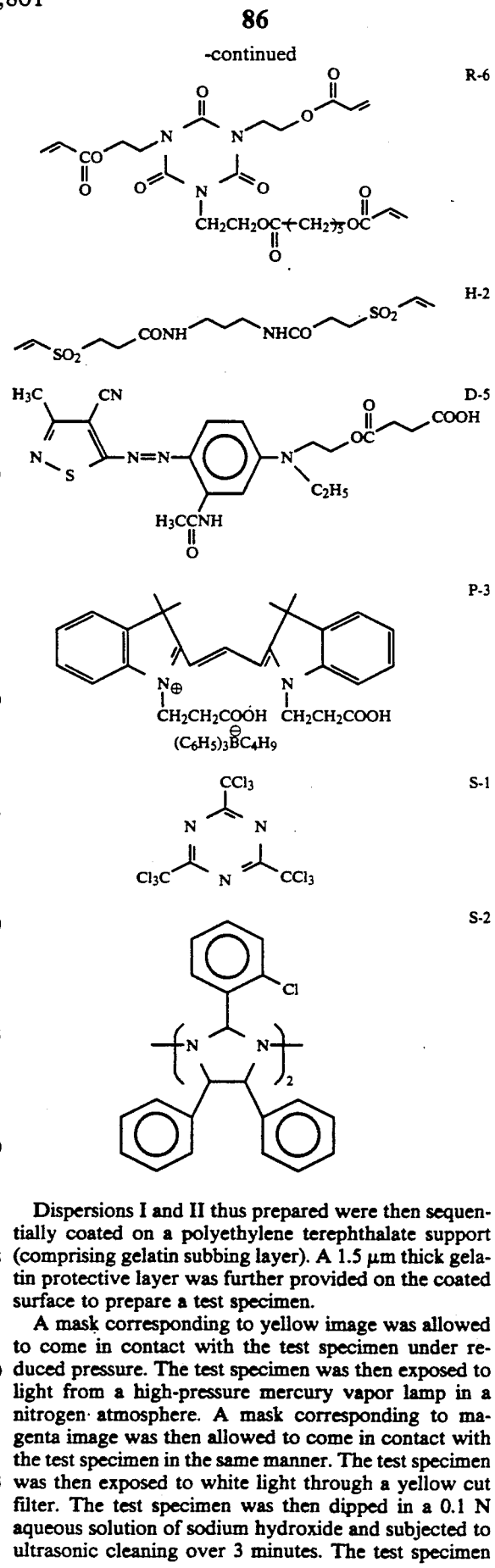

Dispersions I and II thus prepared were then sequentially coated on a polyethylene terephthalate support (comprising gelatin subbing layer). A 1.5 μm thick gelatin protective layer was further provided on the coated surface to prepare a test specimen.

A mask corresponding to yellow image was allowed to come in contact with the test specimen under reduced pressure. The test specimen was then exposed to light from a high-pressure mercury vapor lamp in a nitrogen atmosphere. A mask corresponding to magenta image was then allowed to come in contact with the test specimen in the same manner. The test specimen was then exposed to white light through a yellow cut filter. The test specimen was then dipped in a 0.1 N aqueous solution of sodium hydroxide and subjected to ultrasonic cleaning over 3 minutes. The test specimen was further dipped in a 5% aqueous ammonia solution and cleaned over 2 minutes. The test specimen was further washed with tap water. The resulting images were yellow and magenta images corresponding to the yellow and magenta mask, respectively, and a red image formed of the two colors with an excellent three color S/N ratio.

TABLE 5

|  | Maximum density | Minimum density |
|---|---|---|
| Yellow | 2.10 | 0.15 |
| Magenta | 2.31 | 0.22 |
| (Reflection density) | | |

EXAMPLE 4

The following layers BL, RL and GL and a gelatin protective layer (1.0 g/m²) were sequentially coated on a polyethylene terephthalate support to prepare a test specimen.

(I) BL Layer (2.5 g/m² of a dispersion of the following compounds)

| a) | Magenta image-forming substance D-5 | 1.98 g |
|---|---|---|
| b) | Cyan image-forming substance D-6 | 1.32 g |

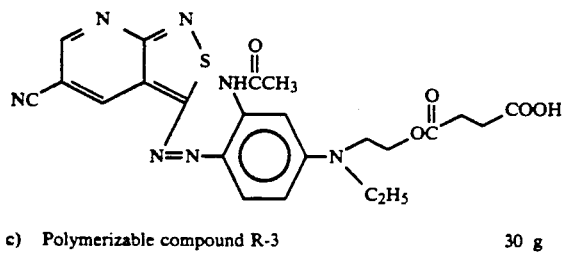

| c) | Polymerizable compound R-3 | 30 g |
|---|---|---|

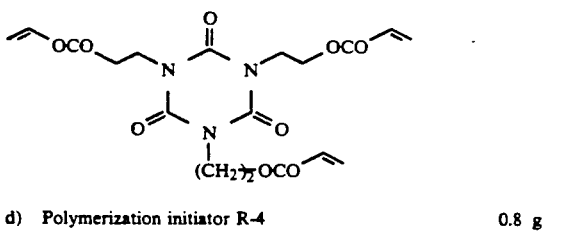

| d) | Polymerization initiator R-4 | 0.8 g |
|---|---|---|

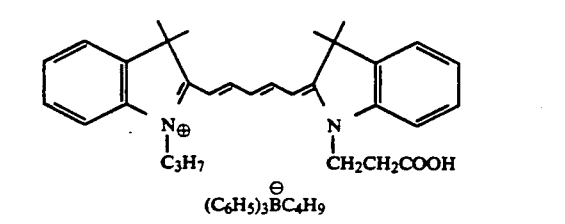

| e) | Sensitizer S-1 | 0.6 g |
|---|---|---|
|  | S-2 | 0.6 g |
|  | S-3 | 0.3 g |

S-3

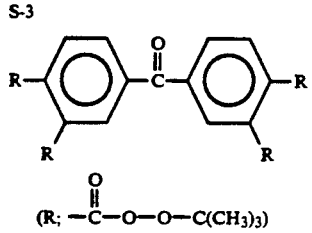

(R; —C—O—O—C(CH$_3$)$_3$)

| f) | Pentamethylaniline | 1.0 g |
|---|---|---|
| g) | 1% Aqueous solution of surface active agent K-1 | 30 ml |
| h) | 10% Gelatin | 300 g |
| i) | 2% Aqueous solution of a 3:1 mixture of film hardeners H-1 and H-2 | 50 ml |

(II) RL Layer (1.4 g/m² of a dispersion of the following compounds)

| a) | Yellow image-forming substance D-4 | 1.93 g |
|---|---|---|
| b) | Magenta image-forming substance D-5 | 1.38 g |
| c) | Polymerizable compound R-3 | 30 g |
| d) | Polymerization initiator P-5 | 0.7 g |

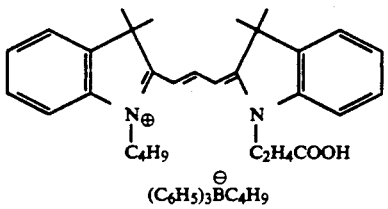

| e) | Sensitizer S-1 | 0.8 g |
|---|---|---|
| f)–i) | Same as in BL Layer | |

(III) GL Layer (1.6 g/m² of a dispersion of the following compounds)

| a) | Yellow image-forming substance D-4 | 2.31 g |
|---|---|---|
| b) | Cyan image-forming substance D-6 | 1.00 g |
| c) | Polymerizable compound R-3 | 30 g |
| d) | Polymerization initiator P-6 | 0.5 g |

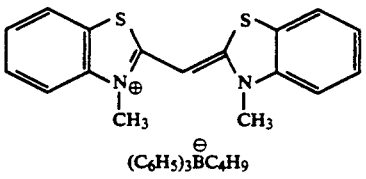

| e) | Sensitizer S-3 | 0.3 g |
|---|---|---|
|  | S-4 | 0.3 g |

S-4

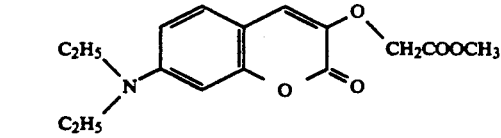

f)–i) Same as in BL Layer

A negative original was allowed to come in contact with the specimen thus prepared under reduced pressure. The specimen was then exposed to while light.

After exposure, the specimen was then dipped in the following processing solution and subjected to ultrasonic treatment over 5 minutes.

| Processing Solution | |
|---|---|
| NaOH | 4 g |
| Tetrabutylammonium chloride | 100 mg |
| Isobutyl alcohol | 5 ml |

| Processing Solution | |
|---|---|
| Water | 100 ml |

The specimen was then dipped in dilute hydrochloric acid (1N aqueous solution of hydrochloric acid) over 5 minutes, washed with water, further dipped in a 10% aqueous solution of potassium hydroxide over 5 minutes, thoroughly washed with water, and dried. The finished specimen provided a full-color positive image corresponding to the negative original.

EXAMPLE 5

A test specimen was prepared in the same manner as in Example 4 except that glass was used as a support.

Yellow, magenta, cyan and colorless striped mosaic filters (photomasks having pixels of 100 μm×150 μm and stripes of 40 μm wide) were allowed to come in contact with the color light-sensitive material specimen in vacuo. Furthermore, a black paper was allowed to come in contact with the opposite surface of the specimen to inhibit halation. The test specimen was then exposed to light of 5,000 lux from a tungsten lamp at a temperature of 50° C. over 10 minutes. The light-sensitive material specimen thus exposed was then allowed to stand at a temperature of 90° C. over 30 seconds. The test specimen was then sequentially processed in Processing Solution A (0.5N aqueous solution of sodium hydroxide), Processing Solution B (1N aqueous solution of hydrochloric acid) and Processing Solution C (2% aqueous ammonia) at room temperature over 5 minutes (subjected to ultrasonic treatment over 2 minutes, allowed to stand over 1 minute, and subjected to ultrasonic treatment over 2 minutes), and washed with tap water over 10 minutes. As a result, blue, green, red and black mosaic color filters were formed on the glass substrate. These materials were then entirely exposed to light to finish the desired specimens.

These blue, green, and red color filters had pixels with a sufficient spectral absorptivity for color filter with little unevenness and defects.

These blue, green and red color filters were then measured for transmission density. The results are set forth in Table 6.

TABLE 6

| | B | G | R |
|---|---|---|---|
| Density | 2.20 | 2.08 | 2.12 |

The polymer grains constituting these pixels had a mean diameter of 0.6 μm, and the resolving power of the pixel edges were satisfactory for filter. The resolving power was determined by the distance L of the transient portion (distance between the pixel edge and the point at which the density is one tenth of that of the central portion). The results are set forth in TABLE 7.

TABLE 7

| | B | G | R |
|---|---|---|---|
| L (μm) | 2 | 2 | 3 |

These color filters were washed with pure water at a temperature of 25° C. over 10 minutes, and then dried. A strong protective film (1.2 μm thick) of the cured polymerizable compound R-3 was further provided on the protective surface of the specimens.

The tops of these color filters were then covered with indium tin oxide (ITO) to provide a common electrode thereon.

The formation of the common electrode was effected by ion plating.

The ITO layer was then covered with a polyimide film which was then cured. These specimens were then subjected to rubbing to provide a liquid crystal-oriented film thereon.

The other substrate which constitutes the liquid crystal cell was prepared by forming an electrode having the same pattern as the color filters in a known process, wiring the electrode, and then covering the electrode with an oriented film. These two substrates were laminated. A liquid crystal was then poured into the laminate. A polarization film was then glued to the laminate to prepare liquid crystal cell specimens.

As compared to liquid crystal cell specimens comprising color filters prepared according to dyeing process, these liquid crystal cell specimens exhibited satisfactory sharpness and durability for display.

EXAMPLE 6

5 cc of a 5% aqueous solution of a surface active agent K-11 was added to 25 g of an 8% aqueous solution of gelatin. The mixture was then stirred at a temperature of 45° C. A solution was then prepared from 400 mg of a color image-forming substance D-11, 4 g of a polymerizable compound R-11, 150 mg of a photopolymerization initiator P-11, and 5 cc of dichloromethane.

The solution thus prepared was then added to the previously prepared gelatin solution with stirring. The mixture was then subjected to emulsion dispersion in a homogenizer at 15,000 rpm and a temperature of 45° C. over 5 minutes. 2 cc of an 8% aqueous solution of a film hardener H-11, 3 cc of an aqueous solution of a thickening agent B-11 and 16 cc of water were added to the dispersion to prepare a coating solution. The coating solution thus prepared was then coated on a polyethylene terephthalate film (comprising gelatin subbing layer) to a wet film thickness of 45 μm. On the coated surface of the specimen was then coated the following protective layer composition to a wet film thickness of 30 μm to prepare Specimen S-21.

| Protective Layer Coating Solution | |
|---|---|
| 10% Gelatin | 500 g |
| Water | 140 g |
| 5% Surface active agent K-12 | 30 cc |
| Thickening agent B-11 | 10 cc |

B-11 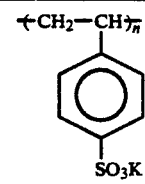

D-11 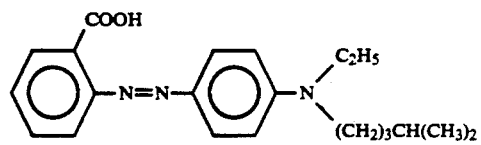

-continued

H-11

(CH₂)₄(OCH₂—CH——CH₂)₂ with epoxide O

K-11

$C_{12}H_{25}$—⟨phenyl⟩—$SO_3Na$

K-12

$CH_2CO_2CH_2CH(C_2H_5)C_4H_9$
|
$NaO_3SCHCO_2CH_2CH(C_2H_5)C_4H_9$

P-11

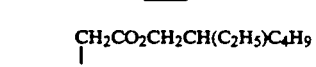

R-11

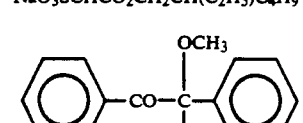
$CH_2=CHCO_2(CH_2)_2N$    $N—(CH_2)_2OCOCH=CH_2$
(triazine ring with carbonyls)
$(CH_2)_2OCOCH=CH_2$ Specimen S-11 thus prepared was then exposed to light over about 4 minutes by means of Handy Cure 400 available from Ushio Denki K.K. The specimen thus exposed was then processed in the following processing solution over 2 minutes, and washed with water over 1 minute.

| Processing Solution | |
|---|---|
| Sodium hydrosulfite | 5 g |
| Sodium carbonate | 9 g |
| Sodium bicarbonate | 4 g |
| Water to make | 200 cc |

The specimen thus processed was then measured for density by means of a spectrophotometer available from Hitachi, Ltd. The results are set forth in Table 8.

TABLE 8

| Specimen S-21 | Transmission density (500 nm) |
|---|---|
| Unprocessed | 2.5 |
| Processed: Exposed | 2.0 |
| Unexposed | 0.04 |

Table 8 shows that the present method can provide an excellent S/N ratio.

Specimens S-22 to S-29 were prepared in the same manner as in Specimen S-21 except that the color image-forming substance was replaced by the exemplary compounds (b)-1, (b)-2, (b)-7, (b)-12, (b)-24, (b)-30, (b)-32, and (b)-47, respectively, and then processed in the same manner as in Specimen S-21.

The results are set forth in Table 9.

TABLE 9

| Specimen | Density at Unprocessed Portion | Density at Processed Portion | |
|---|---|---|---|
| | | Exposed | Unexposed |
| S-22 | 2.0 | 1.42 | 0.03 |
| S-23 | 2.1 | 1.40 | 0.02 |
| S-24 | 2.3 | 2.1 | 0.03 |
| S-25 | 2.0 | 1.70 | 0.02 |

TABLE 9-continued

| Specimen | Density at Unprocessed Portion | Density at Processed Portion | |
|---|---|---|---|
| | | Exposed | Unexposed |
| S-26 | 2.1 | 1.65 | 0.09 |
| S-27 | 2.1 | 1.80 | 0.03 |
| S-28 | 2.0 | 1.62 | 0.04 |
| S-29 | 2.1 | 1.79 | 0.00 |

Table 9 shows that these specimens, too, exhibited excellent results.

Specimens S-30, S-31, S-32 and S-33 were prepared in the same manner as in Specimen S-21 except that the polymerizable compound R-11 was replaced by polymerizable compounds R-12, R-13, R-14 and R-15, respectively, and then exposed to light in the same manner as in Specimen S-21.

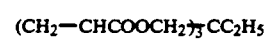
$(CH_2=CHCOOCH_2)_3CC_2H_5$    R-12

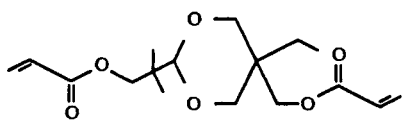
R-13

R-14

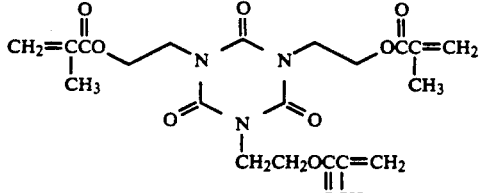

$\left[ (CH_2=CHCOCH_2)_3CCH_2 \right]_2 O$    R-15

As shown in Table 10, these specimens comprising other various polymerizable compounds, too, exhibited an excellent discrimination at both the exposed and unexposed portions.

TABLE 10

| Specimen | Transmission density after washing | |
|---|---|---|
| | Exposed portion | Unexposed portion |
| S-30 | 0.81 | 0.01 |
| S-31 | 1.85 | 0.03 |
| S-32 | 1.95 | 0.04 |
| S-33 | 1.45 | 0.05 |

EXAMPLE 7

Specimen S-34 was prepared in the same manner as in S-21 of Example 6 except that 0.02 g of a sensitizing dye Z-11 and 0.06 g of a sensitization aid X-11 were used instead of the photopolymerization initiator P-11.

A protective layer was also provided on the specimen in the same manner as in Specimen S-21. The specimen thus prepared was then exposed to light from a halogen lamp at 50,000 CMS through Sharp Cut Filters SC50 and SC60 available from Fuji Photo Film Co., Ltd. (SC50 transmits only light of 500 nm or longer, and SC60 transmits only light of 600 nm or longer.) Specimen S-34 thus exposed was then processed in the same processing solution as used in Example 7.

The results are set forth in Table 11.

| Specimen S-34 | | Maximum Transmission Density |
|---|---|---|
| Unprocessed | | 2.44 |
| Processed: | SC50 | 1.70 |
| | SC60 | 0.23 |
| | Unexposed | 0.15 |

Table 11 shows that the sensitizing dyes are effective for spectral sensitization in the visible range of 500 to 600 nm.

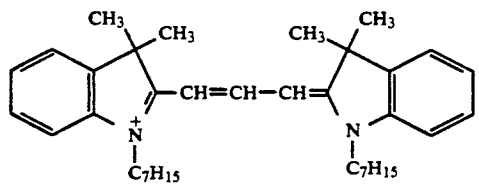

Z-11

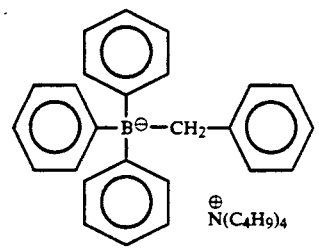

X-11

EXAMPLE 8

Preparation of Dispersion I

A uniform solution of 200 mg of a dye D-12, 5 ml of ethyl acetate, 3 g of a polymerizable compound R-11, 40 mg of a photopolymerization initiator P-11, 10 mg of P-12, 30 mg of 3-thenoyl-7-diethylaminocoumarin, 10 mg of pentamethylaniline, and 10 mg of 2,6-diisopropylaniline was added to 25 g of a 10% aqueous solution of gelatin with stirring at a temperature of 45° C. 4 ml of a 1% aqueous solution of a surface active agent K-11 was added to the material. The mixture was then subjected to dispersion in a homogenizer at 13,000 rpm and a temperature of 40° C. over 5 minutes. 5 g of a 2% aqueous solution of a 3:1 mixture of film hardeners H-12 and H-13 was added to the dispersion. The material was then stirred over 1 minute to prepare Dispersion I.

Preparation of Dispersion II

Dispersion II was prepared from a uniform solution of 200 mg of a dye D-13, 6 ml of ethyl acetate, 3 g of the polymerizable compound R-11, 30 mg of a photopolymerization initiator P-13, 30 mg of a sensitization aid X-11, 10 mg of a sensitizer S-11, 10 mg of a sensitizer S-12, and 5 mg of pentamethylaniline in the same manner as in Dispersion I.

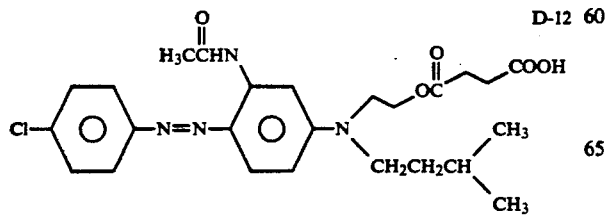

D-12

-continued

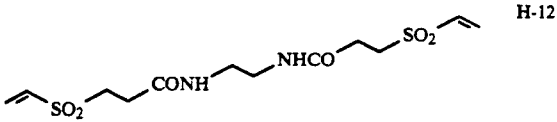

H-12

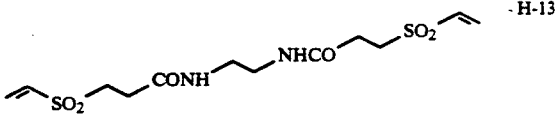

H-13

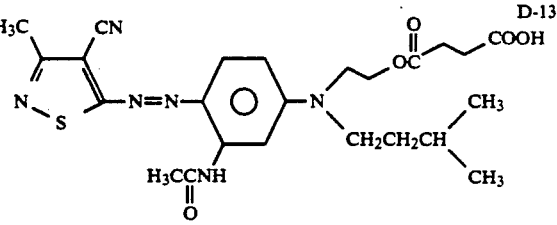

D-13

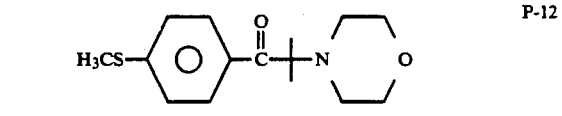

P-12

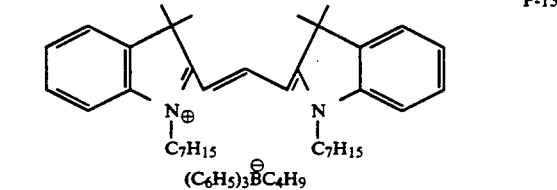

P-13

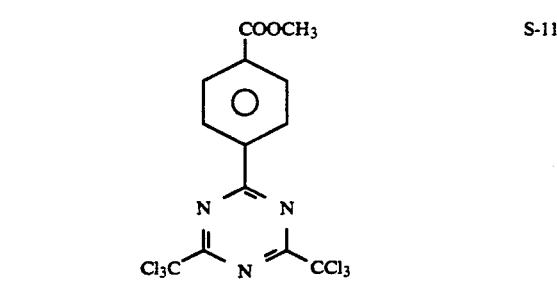

S-11

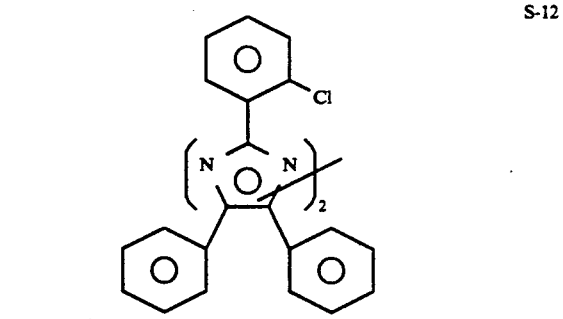

S-12

Dispersions I and II thus prepared were then sequentially coated on a polyethylene terephthalate support (comprising gelatin subbing layer). A gelatin protective layer was further provided on the coated surface in the same manner as in Example 6 to prepare a test specimen.

A mask corresponding to yellow image was allowed to come in contact with the test specimen under reduced pressure. The test specimen was then exposed to light from a high-pressure mercury vapor lamp in a nitrogen atmosphere. A mask corresponding to magenta image was then allowed to come in contact with the test specimen in the same manner. The test specimen was then exposed to white light through a yellow cut filter. The test specimen was then dipped in the same processing solution as used in Example 6 where it was subjected to ultrasonic cleaning over 2 minutes. The test specimen was further dipped in a 5% aqueous ammonia solution and cleaned over 1 minute. The test specimen was further washed with tap water over 2 minutes, and dried. The specimen was then entirely exposed to light from a halogen lamp at 50,000 CMS. The resulting images were yellow and magenta images corresponding to the yellow and magenta mask, respectively, and a red image formed of the two colors with an excellent three color S/N ratio.

TABLE 12

|  | Maximum density | Minimum Density |
|---|---|---|
| Yellow | 2.00 | 0.10 |
| Magenta | 2.22 | 0.18 |
|  | (Reflection density) |  |

EXAMPLE 9

The following layers BL, RL and GL and a gelatin protective layer (1.0 g/m$^2$) were sequentially coated on a polyethylene terephthalate support to prepare a test specimen.

(I) BL Layer (1.5 g/m$^2$ of a dispersion of the following compounds)

| a) | Magenta image-forming substance D-13 | 2.00 g |
|---|---|---|
| b) | Cyan image-forming substance D-14 | 1.35 g |

D-14

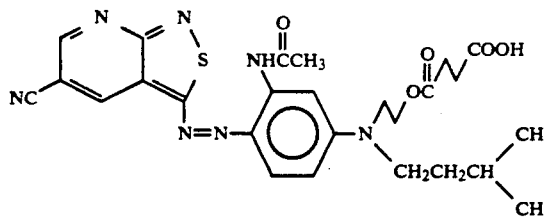

| c) | Polymerizable compound R-11 | 30 g |

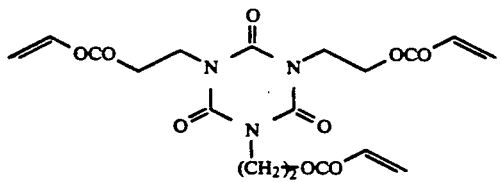

| d) | Polymerization initiator P-14 | 0.7 g |

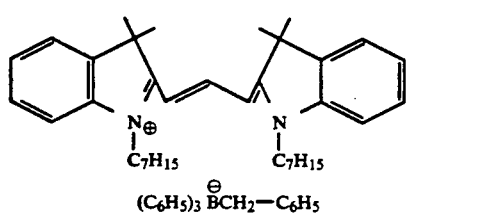

| e) | Sensitizer | X-11 | 0.7 g |
|   |           | S-12 | 0.1 g |

|   |   | S-13 | 0.2 g |

S-13

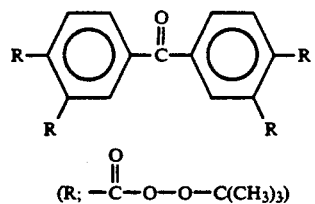

(R; —C(=O)—O—O—C(CH$_3$)$_3$)

| f) | Pentamethylaniline | 0.3 g |
| g) | 1% Aqueous solution of surface active agent K-11 | 30 ml |
| h) | 10% Gelatin | 300 g |
| i) | 2% Aqueous solution of a 3:1 mixture of film hardeners H-12 and H-13 | 50 ml |

(II) RL Layer (1.4 g/m$^2$ of a dispersion of the following compounds)

| a) | Yellow image-forming substance D-12 | 1.95 g |
| b) | Magenta image-forming substance D-13 | 1.40 g |
| c) | Polymerizable compound R-11 | 30 g |
| d) | Polymerization initiator P-15 | 0.7 g |

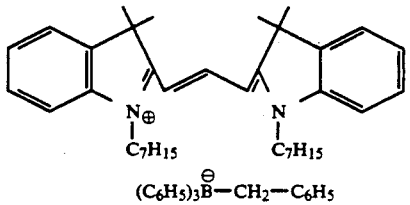

| e) | Sensitizer | X-11 | 0.8 g |
|   |           | S-12 | 0.1 g |
| f)–i) | Same as in BL layer | | |

(III) GL Layer (1.6 g/m$^2$ of a dispersion of the following compounds)

| a) | Yellow image-forming substance D-12 | 2.34 g |
| b) | Cyan image-forming substance D-14 | 1.05 g |
| c) | Polymerizable compound R-11 | 30 g |
| d) | Polymerization initiator P-16 | 0.5 g |

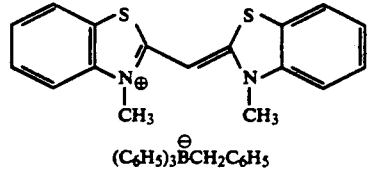

| e) | Sensitizer | X-11 | 0.6 g |
|   |           | S-12 | 0.2 g |
|   |           | S-13 | 0.2 g |
|   |           | S-14 | 0.3 g |

S-14

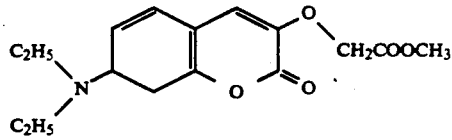

-continued f)–i) Same as in BL Layer

A negative original was allowed to come in contact with the specimen thus prepared under reduced pressure. The specimen was then exposed to white light.

After exposure, the specimen was then dipped in the following processing solution where it was subjected to ultrasonic treatment over 2 minutes.

| Processing Solution | |
| --- | --- |
| Sodium hydrosulfite | 50 g |
| Tetrabutylammonium chloride | 1 g |
| Sodium carbonate | 80 g |
| Sodium bicarbonate | 40 g |
| Isobutyl alcohol | 10 ml |
| Water | 2 l |

The specimen was then thoroughly washed with water, and dried. The specimen was entirely exposed to white light of 50,000 lux over 100 seconds to polymerize the unexposed portions and discolor unnecessary color residue. The finished specimen provided a full-color positive image corresponding to the negative original.

EXAMPLE 10

A test specimen was prepared in the same manner as in Example 9 except that glass was used as a support.

Yellow, magenta, cyan and colorless striped mosaic filters (photomasks having pixels of 100 $\mu$m × 150 $\mu$m and stripes of 40 $\mu$m wide) were allowed to come in contact with the color light-sensitive material specimen under reduced pressure. Furthermore, a black paper was allowed to come in contact with the opposite surface of the specimen to inhibit halation. The test specimen was then exposed to light of 50,000 lux from a tungsten lamp at a temperature of 40° C. over 1.5 minutes. The light-sensitive material specimen thus exposed was then processed with the same processing solution as used in Example 9 in the same manner as in Example 9, washed with tap water over 10 minutes, and dried. The specimen was then exposed to light of 50,000 lux by means of the same exposure apparatus as used above over 1.5 minutes. As a result, blue, green, red and black mosaic color filters were formed on the glass substrate.

These blue, green, and red color filters had pixels with a sufficient spectral absorptivity for color filter with little unevenness and defects.

These blue, green and red color filters were then measured for transmission density. The results are set forth in Table 13.

TABLE 13

| | B | G | R |
| --- | --- | --- | --- |
| Density | 2.10 | 1.95 | 2.05 |

The polymer grains constituting these pixels had a mean diameter of 0.6 $\mu$m, and the resolving power of the pixel edges was satisfactory for filter. The resolving power was determined by the distance L of the transient portion (distance between the pixel edge and the point at which the density is one tenth of that of the central portion). The results are set forth in Table 14.

TABLE 14

| | B | G | R |
| --- | --- | --- | --- |
| L ($\mu$m) | 2.5 | 2.5 | 3.0 |

These color filters were washed with pure water at a temperature of 25° C. over 10 minutes, and then dried. A strong protective film (1.2 $\mu$m thick) of cured polymerizable compound R-11 was further provided on the protective surface of the specimens.

The top of these color filters were then covered with indium tin oxide (ITO) to provide a common electrode thereon.

The formation of the common electrode was effected by ion plating.

The ITO layer was then covered with a polyimide film which was then cured. These specimens were then subjected to rubbing to provide a liquid crystal-oriented film thereon.

The other substrate which constitutes the liquid crystal cell was prepared by forming an electrode having the same pattern as the color filters in a known process, wiring the electrode, and then covering the electrode with an oriented film. These two substrates were laminated. A liquid crystal was then poured into the laminate. A polarization film was then glued to the laminate to prepare liquid crystal cell specimens.

As compared to liquid crystal cell specimens comprising color filters prepared according to dyeing process, these liquid crystal cell specimens exhibited satisfactory sharpness and durability for display.

While the invention has been described in detail and with reference to specific embodiments thereof, it will be apparent to one skilled in the art that various changes and modifications can be made therein without departing from the spirit and scope thereof.

What is claimed is:

1. A color image recording method, which comprises
    exposing to light a light-sensitive material, which is substantially silver halide free, obtained by dispersing a composition containing at least a photopolymerization initiator, a color-image forming substance and a polymerizable compound in a hydrophilic binder and then coating said dispersion on a support,
    subjecting said polymerizable compound in the exposed portions to light and then
    (a) eluting said color image-forming substance contained in the unpolymerized polymerizable compound in the unexposed portions with an alkaline aqueous solution, or
    (b) subjecting said color image-forming substance contained in the unpolymerized polymerizable compound in the unexposed portions to chemical change so that it is discolored, thereby forming dye images.

2. A color image recording method as claimed in claim 1, wherein said light-sensitive material comprises at least three combined elements of polymerization initiator, polymerizable compound and color image-forming substance and the spectral sensitivity of said photopolymerization initiator and the spectral absorptivity of said color image-forming substance are different between said combined elements.

3. A color image recording method as claimed in claim 2, wherein a light-sensitive composition comprising a dispersion of a polymerizable compound containing at least two or more photopolymerization initiators having different spectral sensitivities and color image-forming substances having different spectral absorptivity coated in multi-layer construction by layers is used.

4. A color image recording method as claimed in claim 3, wherein said light-sensitive composition is exposed to light having two or more different wavelengths plural times to form a multi-color image comprising two or more color image-forming substances.

5. A color image recording method as claimed in claim 3, wherein said light-sensitive composition is exposed to light through a negative color original at a shot to form a full-color positive image.

6. A color image recording method as claimed in claim 3, wherein said light-sensitive composition is exposed to light through a color mosaic mask to form a multi-color mosaic.

7. A color image recording method as claimed in claim 2, wherein said color image-forming substance comprises a combination of cyan, magenta and yellow.

8. A color image recording method as claimed in claim 2, wherein at least one of said photopolymerization initiators has spectral sensitivity in a wavelength of 600 nm or more.

9. A color image recording method as claimed in claim 1, wherein in the embodiment (a) said color image-forming substance is an organic dye which undergoes reaction and/or dissociation during the washing with an alkaline aqueous solution to become water-soluble.

10. A color image recording method as claimed in claim 9, wherein in the embodiment (a) said color image-forming substance is an organic dye which contains a dissociative group having a pKa of 11 or less in the form of its precursor and undergoes reaction and/or dissociation during the washing with an alkaline aqueous solution to become water-soluble.

11. A color image recording method as claimed in claim 1, wherein in the embodiment (b) said color image-forming substance is an organic dye containing an azo group and said discoloration is effected by the reduction reaction with said processing solution.

12. A color image recording method as claimed in claim 1, wherein in the embodiment (b) a processing solution to be used contains $S_2O_4^{2-}$ ions.

13. A color image recording method as claimed in claim 1, wherein said color image-forming substance is capable of being eluted with an alkaline aqueous solution or is capable of undergoing chemical change to cause discolorization.

* * * * *